(12) United States Patent
Yamazaki et al.

(10) Patent No.: US 11,574,573 B2
(45) Date of Patent: Feb. 7, 2023

(54) DISPLAY SYSTEM

(71) Applicant: Semiconductor Energy Laboratory Co., Ltd., Atsugi (JP)

(72) Inventors: Shunpei Yamazaki, Setagaya (JP); Koji Kusunoki, Isehara (JP); Susumu Kawashima, Atsugi (JP); Kouhei Toyotaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/636,435

(22) PCT Filed: Aug. 24, 2018

(86) PCT No.: PCT/IB2018/056411
§ 371 (c)(1),
(2) Date: Feb. 4, 2020

(87) PCT Pub. No.: WO2019/048966
PCT Pub. Date: Mar. 14, 2019

(65) Prior Publication Data
US 2020/0175905 A1  Jun. 4, 2020

(30) Foreign Application Priority Data

Sep. 5, 2017 (JP) ............................. JP2017-170206
Feb. 22, 2018 (JP) ............................. JP2018-029361

(51) Int. Cl.
*G09G 3/20* (2006.01)
*G02F 1/1343* (2006.01)
(Continued)

(52) U.S. Cl.
CPC ............. *G09G 3/20* (2013.01); *G02F 1/1368* (2013.01); *G02F 1/13624* (2013.01);
(Continued)

(58) Field of Classification Search
None
See application file for complete search history.

(56) References Cited

U.S. PATENT DOCUMENTS 6,331,844 B1  12/2001  Okumura et al.
6,563,480 B1   5/2003  Nakamura
(Continued)

FOREIGN PATENT DOCUMENTS

CN  001407526 A  4/2003
CN  103035189 A  4/2013
(Continued)

OTHER PUBLICATIONS

International Search Report (Application No. PCT/IB2018/056411) dated Dec. 18, 2018.
(Continued)

*Primary Examiner* — Yi Wang
(74) *Attorney, Agent, or Firm* — Robinson Intellectual Property Law Office; Eric J. Robinson

(57) ABSTRACT

A high-resolution display system is provided.
A display system with high display quality is provided. The display system includes a processing unit and a display unit. A first image signal is supplied to the processing unit. The processing unit has a function of generating a second image signal by using the first image signal. The processing unit has a function of generating a correction signal. The display unit includes a pixel. The pixel includes a display element and a memory circuit. The second image signal and the correction signal are supplied to the pixel. The memory circuit has a function of retaining the correction signal.

31 Claims, 27 Drawing Sheets

(51) Int. Cl.

| | | |
|---|---|---|
| *G02F 1/1362* | (2006.01) | |
| *G02F 1/1368* | (2006.01) | |
| *G06N 3/04* | (2006.01) | |
| *G06T 3/40* | (2006.01) | |
| *H01L 27/12* | (2006.01) | |
| *G02F 1/1335* | (2006.01) | |
| *H01L 27/32* | (2006.01) | |

(52) U.S. Cl.
CPC ......... *G02F 1/134363* (2013.01); *G06N 3/04* (2013.01); *G06T 3/4046* (2013.01); *H01L 27/1225* (2013.01); *G02F 1/133514* (2013.01); *G02F 1/133528* (2013.01); *G02F 1/134372* (2021.01); *G02F 2201/121* (2013.01); *G02F 2201/123* (2013.01); *G09G 2320/0233* (2013.01); *G09G 2330/021* (2013.01); *G09G 2340/0407* (2013.01); *H01L 27/3244* (2013.01)

(56) References Cited

U.S. PATENT DOCUMENTS

| | | | |
|---|---|---|---|
| 7,088,052 B2 | 8/2006 | Kimura | |
| 7,224,339 B2 | 5/2007 | Koyama et al. | |
| 7,674,650 B2 | 3/2010 | Akimoto et al. | |
| 7,969,398 B2 | 6/2011 | Shirasaki et al. | |
| 8,339,427 B2 | 12/2012 | Shirasaki et al. | |
| 8,466,910 B2 | 6/2013 | Shirasaki et al. | |
| 8,760,376 B2 | 6/2014 | Koyama et al. | |
| 8,860,108 B2 | 10/2014 | Yamazaki et al. | |
| 8,884,852 B2 | 11/2014 | Yamamoto et al. | |
| 8,947,328 B2 | 2/2015 | Kimura | |
| 8,976,090 B2 | 3/2015 | Yamamoto et al. | |
| 9,412,299 B2 | 8/2016 | Miyazawa et al. | |
| 9,881,551 B2 | 1/2018 | Miyazawa et al. | |
| 10,140,940 B2 | 11/2018 | Aoki | |
| 2002/0021274 A1 | 2/2002 | Koyama et al. | |
| 2003/0057895 A1* | 3/2003 | Kimura .............. G09G 3/3233 315/370 | |
| 2006/0001614 A1 | 1/2006 | Hsueh et al. | |
| 2007/0072439 A1 | 3/2007 | Akimoto et al. | |
| 2009/0033818 A1 | 2/2009 | Nakajima et al. | |
| 2009/0141204 A1 | 6/2009 | Numao | |
| 2010/0301326 A1 | 12/2010 | Miyairi et al. | |
| 2011/0101334 A1 | 5/2011 | Yamazaki et al. | |
| 2011/0164071 A1 | 7/2011 | Chung et al. | |
| 2013/0057532 A1 | 3/2013 | Lee et al. | |
| 2013/0082906 A1 | 4/2013 | Toyomura et al. | |
| 2013/0321248 A1 | 12/2013 | Kimura | |
| 2014/0326969 A1 | 11/2014 | Kim | |
| 2015/0060847 A1 | 3/2015 | Miyake | |
| 2015/0170569 A1 | 6/2015 | Han et al. | |
| 2015/0179095 A1 | 6/2015 | Kimura | |
| 2015/0221637 A1 | 8/2015 | Kimura | |
| 2015/0279872 A1* | 10/2015 | Kato .................. H01L 27/1255 257/43 |
| 2016/0064424 A1 | 3/2016 | Umezaki | |
| 2019/0266946 A1 | 8/2019 | Zhu et al. | |
| 2020/0142229 A1 | 5/2020 | Kusunoki et al. | |
| 2020/0175358 A1* | 6/2020 | Kato .................... G06N 3/063 |
| 2020/0194527 A1 | 6/2020 | Kawashima et al. | |

FOREIGN PATENT DOCUMENTS

| | | |
|---|---|---|
| JP | 09-319339 A | 12/1997 |
| JP | 2001-053283 A | 2/2001 |
| JP | 2003-195813 A | 7/2003 |
| JP | 2005-309422 A | 11/2005 |
| JP | 2007-096055 A | 4/2007 |
| JP | 2007-123861 A | 5/2007 |
| JP | 2008-046157 A | 2/2008 |
| JP | 2009-204794 A | 9/2009 |
| JP | 2013-076812 A | 4/2013 |
| JP | 2013-152338 A | 8/2013 |
| JP | 2015-049385 A | 3/2015 |
| JP | 2019-045613 A | 3/2019 |
| JP | 2019-045614 A | 3/2019 |
| KR | 2003-0022084 A | 3/2003 |
| KR | 10-1043673 | 6/2011 |
| TW | I221268 | 9/2004 |

OTHER PUBLICATIONS

Written Opinion (Application No. PCT/IB2018/056411) dated Dec. 18, 2018.

* cited by examiner $a = x_1 w_1 + x_2 w_2 + b$

DISPLAY SYSTEM

TECHNICAL FIELD

One embodiment of the present invention relates to a display system.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

Note that in this specification and the like, a semiconductor device refers to all devices that can function by utilizing semiconductor characteristics. A display device (a liquid crystal display device, a light-emitting display device, and the like), a projection device, a lighting device, an electro-optical device, a power storage device, a memory device, a semiconductor circuit, an imaging device, an electronic device, and the like can be regarded as a semiconductor device, in some cases. Alternatively, it can be regarded that they include a semiconductor device, in some cases.

BACKGROUND ART

In recent years, display devices with high resolution have been demanded. For example, display devices including a large number of pixels such as full high definition (the number of pixels: 1920×1080), 4K (the number of pixels: 3840×2160, 4096×2160, or the like), and 8K (the number of pixels: 7680×4320, 8192×4320, or the like) have been actively developed.

Furthermore, larger display devices have been required. For example, the screen size of mainstream home-use television devices has been 50 inches diagonal or more. A larger screen size allows a larger amount of information to be displayed at a time, and a further increase in screen size has been demanded for digital signage and the like.

Flat panel displays typified by liquid crystal display devices and light-emitting display devices are widely used as display devices. Silicon is chiefly used as a semiconductor material of transistors included in these display devices; recently, a technique in which a transistor using a metal oxide is used in a pixel of a display device has also been developed.

Patent Document 1 discloses a technique in which amorphous silicon is used as a semiconductor material of a transistor. Patent Document 2 and Patent Document 3 each disclose a technique in which a metal oxide is used as a semiconductor material of a transistor.

REFERENCE

Patent Documents

[Patent Document 1] Japanese Published Patent Application No. 2001-053283
[Patent Document 2] Japanese Published Patent Application No. 2007-123861
[Patent Document 3] Japanese Published Patent Application No. 2007-096055

SUMMARY OF THE INVENTION

Problems to be Solved by the Invention

Since high-resolution images such as 8K images have a large amount of data, the communication load when transmitting data from a broadcast station to a receiver is large. Furthermore, technologies for peripherals such as an imaging device, a memory device, and a communication device need to be developed as well in order to make high-resolution images widely available. Thus, a technology in which a low-resolution image is broadcast by a broadcast station and the resolution is increased on the receiver side which receives the broadcast is needed.

With up-conversion, for example, a low-resolution image can be converted into a pseudo high-resolution image. However, an enormous amount of image data is analyzed for generation of new image data when up-conversion is performed; thus, there are problems of increases in circuit scale and power consumption. Moreover, the amount of processing is sometimes too much to handle in real time, causing display delay.

As the number of pixels in a display device becomes larger, the number of transistors and display elements included in the display device increases; thus, display unevenness due to characteristic variation of the transistors and characteristic variation of the display elements becomes noticeable.

An object of one embodiment of the present invention is to provide a high-resolution display system. An object of one embodiment of the present invention is to provide a display system with high display quality. An object of one embodiment of the present invention is to provide a display system with low power consumption. An object of one embodiment of the present invention is to provide a display system in which display unevenness is reduced. An object of one embodiment of the present invention is to provide a display system having a large display region. An object of one embodiment of the present invention is to provide a display system capable of operating at a high frame frequency.

Note that the descriptions of these objects do not disturb the existence of other objects. One embodiment of the present invention does not need to achieve all the objects. Objects other than these can be derived from the descriptions of the specification, the drawings, and the claims.

Means for Solving the Problems

One embodiment of the present invention is a display system including a processing unit and a display unit. A first image signal is supplied to the processing unit. The processing unit has a function of generating a second image signal by using the first image signal. The processing unit has a function of generating a correction signal. The display unit includes a pixel. The pixel includes a display element and a memory circuit. The second image signal and the correction signal are supplied to the pixel. The memory circuit has a function of retaining the correction signal.

One embodiment of the present invention is a display system including a processing unit, a display unit, and a storage unit. The storage unit has correction data. A first image signal and the correction data are supplied to the processing unit. The processing unit has a function of generating a second image signal by using the first image signal. The processing unit has a function of generating a correction signal based on the correction data. The display unit includes a pixel. The pixel includes a display element and a memory circuit. The second image signal and the correction signal are supplied to the pixel. The memory circuit has a function of retaining the correction signal.

One embodiment of the present invention is a display system including a processing unit and a display unit. A first image signal is supplied to the processing unit. The processing unit has a function of generating a second image signal by using the first image signal. The processing unit has a function of generating a correction signal by using the first image signal. The display unit includes a pixel. The pixel includes a display element and a memory circuit. The second image signal and the correction signal are supplied to the pixel. The memory circuit has a function of retaining the correction signal. The display system may further include a storage unit. The storage unit has correction data. The correction data is supplied to the processing unit. The processing unit has a function of generating the correction signal by using the first image signal and the correction data.

One embodiment of the present invention is a display system including a processing unit and a display unit. The display unit includes a first circuit and a pixel. The first circuit has a function of generating a first signal. A first image signal and the first signal are supplied to the processing unit. The processing unit has a function of generating a second image signal by using the first image signal. The processing unit has a function of generating a correction signal by using the first signal. The pixel includes a display element and a memory circuit. The second image signal and the correction signal are supplied to the pixel. The memory circuit has a function of retaining the correction signal. The display system may further include a storage unit. The storage unit has correction data. The correction data is supplied to the processing unit. The processing unit has a function of generating the correction signal by using the first signal and the correction data.

The processing unit may generate one or both of the second image signal and the correction signal using a neural network.

The processing unit may include a neural network circuit.

The pixel may include a first transistor, a second transistor, a third transistor, a fourth transistor, a first capacitor, and a second capacitor. One of a source and a drain of the first transistor is electrically connected to one electrode of the first capacitor. The other electrode of the first capacitor is electrically connected to one of a source and a drain of the second transistor. The one of the source and the drain of the second transistor is electrically connected to a gate of the third transistor. The gate of the third transistor is electrically connected to one electrode of the second capacitor. The other electrode of the second capacitor is electrically connected to one of a source and a drain of the third transistor. The one of the source and the drain of the third transistor is electrically connected to one of a source and a drain of the fourth transistor. The other of the source and the drain of the fourth transistor is electrically connected to one electrode of the display element. The second transistor preferably includes a metal oxide in its channel formation region. The metal oxide preferably contains In, Zn, and M (M is aluminum (Al), titanium (Ti), gallium (Ga), germanium (Ge), yttrium (Y), zirconium (Zr), lanthanum (La), cerium (Ce), tin (Sn), neodymium (Nd), or hafnium (Hf)). The second image signal is supplied to the other of the source and the drain of the first transistor. The correction signal is supplied to the other of the source and the drain of the second transistor.

The pixel may include a first transistor, a second transistor, a third transistor, a fourth transistor, a first capacitor, and a second capacitor. One of a source and a drain of the first transistor is electrically connected to one electrode of the first capacitor. The one electrode of the first capacitor is electrically connected to the display element. One of a source and a drain of the second transistor is electrically connected to the other electrode of the first capacitor. The other electrode of the first capacitor is electrically connected to one of a source and a drain of the third transistor. A gate of the third transistor is electrically connected to one of a source and a drain of the fourth transistor. The one of the source and the drain of the fourth transistor is electrically connected to one electrode of the second capacitor. The fourth transistor preferably includes a metal oxide in its channel formation region. The metal oxide preferably contains In, Zn, and M (M is Al, Ti, Ga, Ge, Y, Zr, La, Ce, Sn, Nd, or Hf). The other of the source and the drain of the second transistor is electrically connected to a low potential power supply line. The other of the source and the drain of the third transistor is electrically connected to a high potential power supply line. The pixel may further include a fifth transistor and a sixth transistor. One of a source and a drain of the fifth transistor is electrically connected to the one of the source and the drain of the first transistor. The other of the source and the drain of the fifth transistor is electrically connected to the display element. One of a source and a drain of the sixth transistor is electrically connected to the other of the source and the drain of the fifth transistor. The other of the source and the drain of the sixth transistor is electrically connected to a low potential power supply line. The second image signal is supplied to the other of the source and the drain of the first transistor. The correction signal is supplied to the other of the source and the drain of the fourth transistor.

In the display system of one embodiment of the present invention, the memory circuit has a function of generating a third image signal by adding the correction signal to the second image signal. In the display system of one embodiment of the present invention, the display element has a function of performing display on the basis of the third image signal.

Effect of the Invention

According to one embodiment of the present invention, a high-resolution display system can be provided. According to one embodiment of the present invention, a display system with high display quality can be provided. According to one embodiment of the present invention, a display system with low power consumption can be provided. According to one embodiment of the present invention, a display system in which display unevenness is reduced can be provided. According to one embodiment of the present invention, a display system having a large display region can be provided. According to one embodiment of the present invention, a display system capable of operating at a high frame frequency can be provided.

Note that the descriptions of these effects do not disturb the existence of other effects. One embodiment of the present invention does not need to have all the effects. Effects other than these can be derived from the descriptions of the specification, the drawings, and the claims.

MODE FOR CARRYING OUT THE INVENTION

Figure 1A:
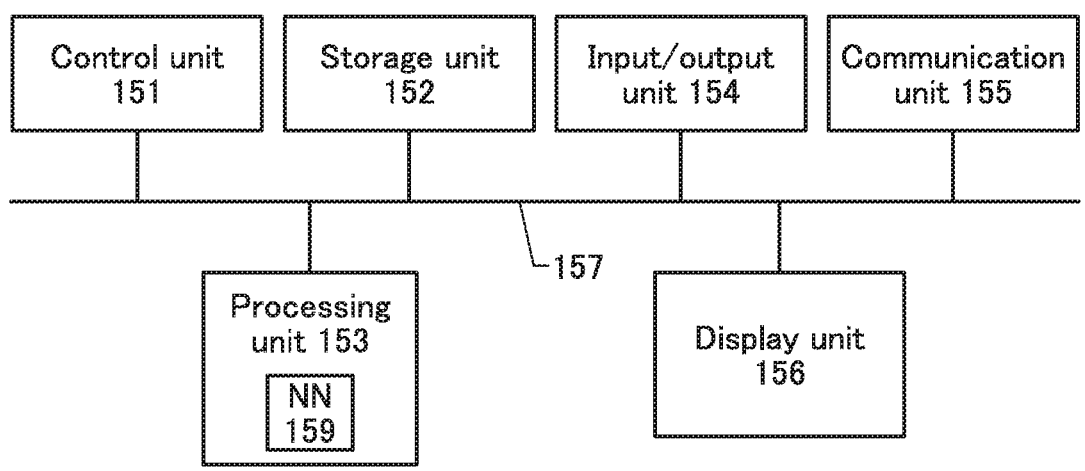
FIG. 1 Diagrams illustrating an example of a display system.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display system of one embodiment of the present invention is described with reference to FIG. 1 to FIG. 17.

The display system of this embodiment has a function of generating a correction signal, a function of generating an image signal by using data received from the outside, and a function of displaying an image by using the correction signal and the image signal.

The display system of this embodiment includes a processing unit and a display unit. The processing unit has a function of generating a correction signal and a function of generating an image signal by using data received from the outside. The display unit includes a display element and a memory circuit. The memory circuit has a function of retaining the correction signal. The memory circuit has a function of adding the correction signal to the image signal. The correction signal is added to the image signal by capacitive coupling and then supplied to the display element. Accordingly, the display unit can display an image by using the correction signal and the image signal.

In a display system, a variety of image processings are performed on data received from the outside. In addition, in the case where up-conversion of the resolution is performed, an enormous amount of arithmetic operation is performed by a processing unit. In view of the above, in the display system of one embodiment of the present invention, the processing unit generates a correction signal and an image signal. The image signal, which is generated by performing image processing on data received from the outside, is a signal including data whose resolution is equivalent to that of the data received from the outside. Then, the correction signal, which is generated separately, is added to the image signal, whereby up-conversion of an image is performed. Accordingly, the amount of arithmetic operation performed by the processing unit can be reduced, power consumption can be reduced, the circuit scale can be reduced, or display delay can be inhibited, for example.

The processing unit may generate a correction signal in real time by using data received from the outside or the like, or may read correction data stored in a recording medium to generate a correction signal based on the correction data. When the correction signal based on the correction data, without using data received from the outside, is supplied to the display unit, the amount of arithmetic operation performed by the processing unit can be reduced.

Note that the correction signal can be used for the purpose other than up-conversion. For example, display unevenness due to characteristic variation of transistors included in pixels can be corrected by using the correction signal. As described here, the use of the correction signal can reduce the load of the processing unit involved in generation of an image signal.

<Structure Example 1 of Display System>

FIG. 1(A) illustrates a block diagram of a display system 100A.

The display system 100A includes a control unit 151, a storage unit 152, a processing unit 153, an input/output unit 154, a communication unit 155, and a display unit 156. In addition, a touch sensor, a touch sensor control unit, a battery, a battery controller, a power receiving unit, an antenna, an imaging unit, a vibration unit, or the like may be included. The control unit 151, the storage unit 152, the processing unit 153, the input/output unit 154, the communication unit 155, and the display unit 156 are electrically connected to one another through a bus line 157.

Generation of an image signal S2 and a correction signal W2 in the display system 100A is described with reference to FIG. 1(B).

The communication unit 155 supplies an image signal S1 based on data received from the outside to the processing unit 153. The processing unit 153 performs image processing on data included in the image signal S1 to generate the image signal S2. The image signal S2 is supplied from the processing unit 153 to the display unit 156.

The processing unit 153 preferably has a function of generating the image signal S2 utilizing artificial intelligence (AI). In that case, the display quality of the display unit 156 can be increased.

Note that artificial intelligence refers to a computer that imitates the intelligence of human beings. For example, an artificial neural network (ANN) can be used for the processing unit 153. The artificial neural network is a circuit that imitates a neural network composed of neurons and synapses, and the artificial neural network is a kind of artificial intelligence. When "neural network" is stated in this specification and the like, it particularly refers to an artificial neural network.

Figure 1B:
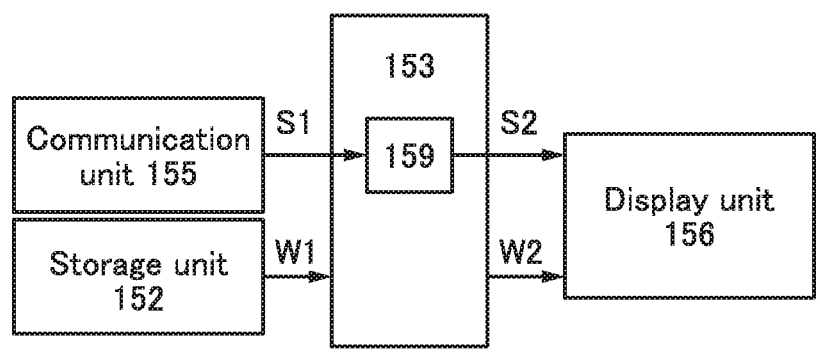

FIG. 1(A) and FIG. 1(B) illustrate an example in which the processing unit 153 includes a neural network 159.

Examples of the image processing performed on the data included in the image signal S1 include noise removal processing, gray level conversion processing, tone correction processing, luminance correction processing, and the like. The tone correction processing and the luminance correction processing can be performed with the use of gamma correction or the like. Furthermore, the processing unit 153 may have a function of executing frame interpolation processing accompanying up-conversion of the frame frequency, for example.

Examples of the noise removal processing include removal of various noise such as mosquito noise that appears near the outlines of characters and the like, block noise that appears in high-speed moving images, random noise that causes flicker, and dot noise caused by up-conversion of the resolution.

The gray level conversion processing is processing of converting the gray level expressed by image data included in the image signal S1 to a gray level corresponding to the output characteristics of the display unit 156. For example, in the case where the number of gray levels is increased, gray levels for pixels are interpolated to an image input with a small number of gray levels and assigned to the pixels, so that processing for smoothing a histogram can be executed. A high-dynamic range (HDR) processing for increasing the dynamic range is also included in the gray level conversion processing.

The tone correction processing is processing of correcting the tone of an image. The luminance correction processing is processing of correcting the brightness (luminance contrast) of an image. The luminance and tone of an image to be displayed on the display unit 156 are corrected to be optimal, in accordance with the kind, luminance, color purity, or the like of lighting of a room where the display unit 156 is provided, for example.

The frame interpolation processing is processing of generating an image for a frame that does not exist actually (an interpolation frame) in the case where the frame frequency of an image to be displayed is increased. For example, an image for an interpolation frame that is interposed between certain two images is generated from a difference between the two images. Alternatively, images for a plurality of interpolation frames can be generated between the two images. For example, when the frame frequency of image data is 60 Hz, a plurality of interpolation frames are generated, in which case the frame frequency of an image signal output to the display unit 156 can be increased twofold to 120 Hz, fourfold to 240 Hz, or eightfold to 480 Hz, for example.

Correction data W1 is supplied from the storage unit 152 to the processing unit 153. The processing unit 153 generates the correction signal W2 based on the correction data W1. The correction signal W2 is supplied from the processing unit 153 to the display unit 156.

The correction data W1 is preferably data generated in advance utilizing artificial intelligence.

The correction signal W2 generated by using the correction data W1 is added to the image signal S2, whereby up-conversion of an image can be performed, for example. Alternatively, display unevenness due to characteristic variation of transistors included in pixels can be corrected.

Up-conversion of the display system of one embodiment of the present invention and up-conversion of a comparative example are described with reference to FIG. 2 and FIG. 3.

In the case where the image signal S2 is generated without up-conversion of the image signal S1 and the correction signal W2 is not used, the same image signal is supplied to a plurality of pixels in order that the display unit 156 with high resolution may display low-resolution image data. For example, the pixel count of an 8K4K display device is four times the pixel count of a 4K2K display device (3840× 2160). That is, in order that an 8K4K display device may simply display image data for a 4K2K display device, an image signal that is supplied to one pixel of the 4K2K display device is supplied to four pixels of the 8K4K display device.

Figure 3:
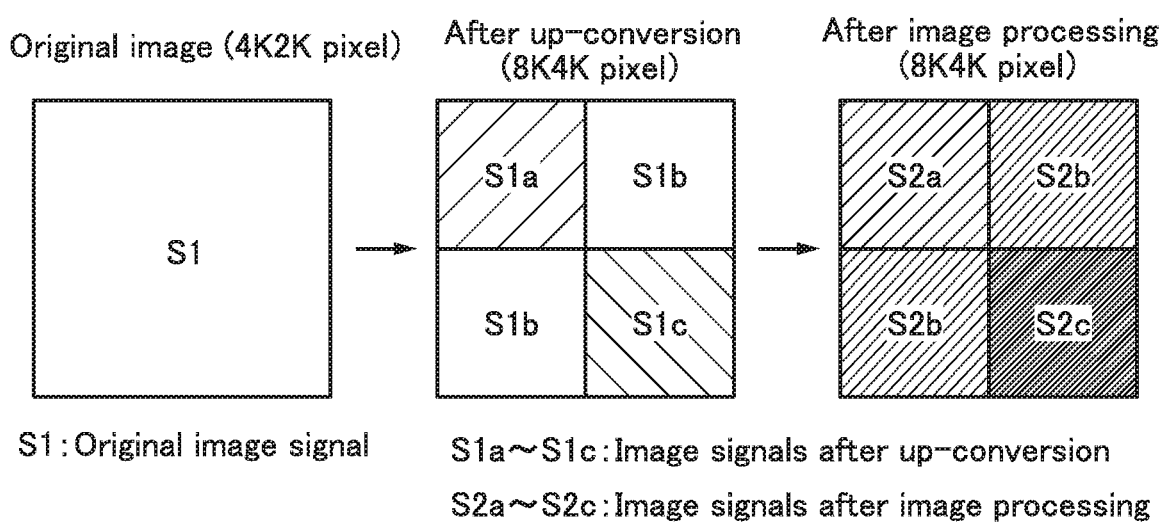
FIG. 3 A diagram for describing a comparative example of up-conversion.

FIG. 3 is a diagram illustrating an image displayed by four pixels in the horizontal and vertical directions in the comparative example and assuming the above condition. As illustrated in FIG. 3, an image is displayed by all the four pixels by using the image signal S1 before up-conversion, whereas image signals S1a to S1c are supplied to the respective pixels after the up-conversion, resulting in an increase in resolution. Furthermore, image processing is performed after the up-conversion, whereby a higher-quality image can be displayed. After the image processing, image signals S2a to S2c are supplied to the respective pixels.

However, the image processing performed after the up-conversion increases the amount of arithmetic operation, leading to an increase in the power consumption of a processing unit and display delay.

Figure 2A:
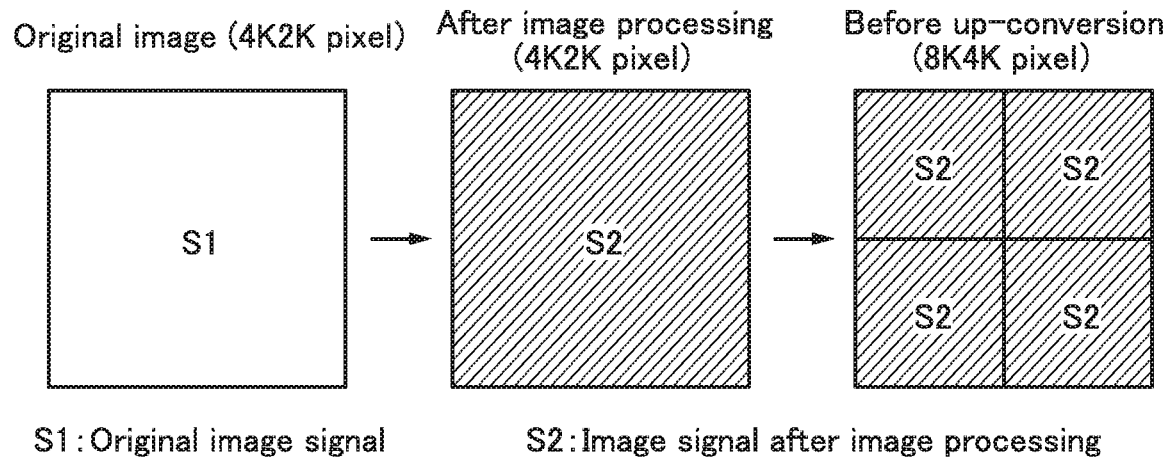
FIG. 2 Diagrams for describing up-conversion.

Meanwhile, a correction signal can be added to an image signal in the display system of one embodiment of the present invention. Thus, image processing is performed on the image signal S1 without up-conversion of the image signal S1 as illustrated in FIG. 2(A), so that the image signal S2 is generated. Accordingly, the amount of arithmetic operation of the image processing can be reduced, leading to a reduction in power consumption. Then, the same image signal S2 is supplied to four pixels.

Correction signals W2a to W2c are supplied to the respective pixels. Here, there is no limitation on a method for generating the correction signals W2a to W2c. The correction data W1 stored in the storage unit 152 may be read and the correction signal W2 based on the correction data W1 may be generated as illustrated in FIG. 1(B). It is preferable that the correction signal W2 be generated not in real time because power consumption is reduced owing to a reduction in the amount of arithmetic operation and display delay can be inhibited. The correction signal W2 may be generated in real time by using the image signal S1 as described later (see FIG. 4(B) or the like). It is preferable that the correction signal W2 be generated in real time because the quality of up-conversion can be increased. The amount of arithmetic operation of the generation of the image signal S2 can be reduced also in this case. It is particularly preferable that the image signal S2 be generated at the same time as the correction signal W2 because display delay can be inhibited.

Figure 2B:
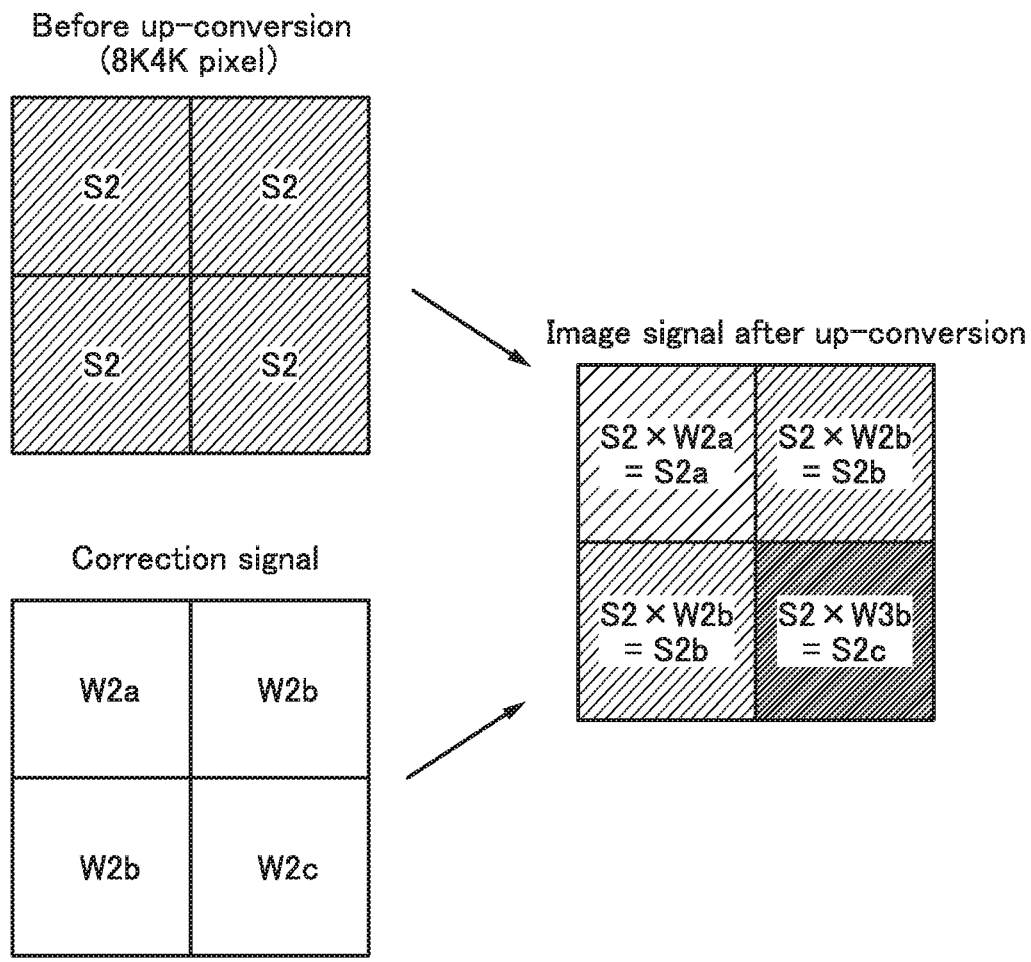

Then, the correction signals are added to the respective image signals S2 as illustrated in FIG. 2(B), whereby new image signals S2a to S2c are generated. Since the correction signals are added to the respective image signals S2 generated by the image processing, the original image signal S1 that has been up-converted can be displayed by the pixels.

Figure 4A:
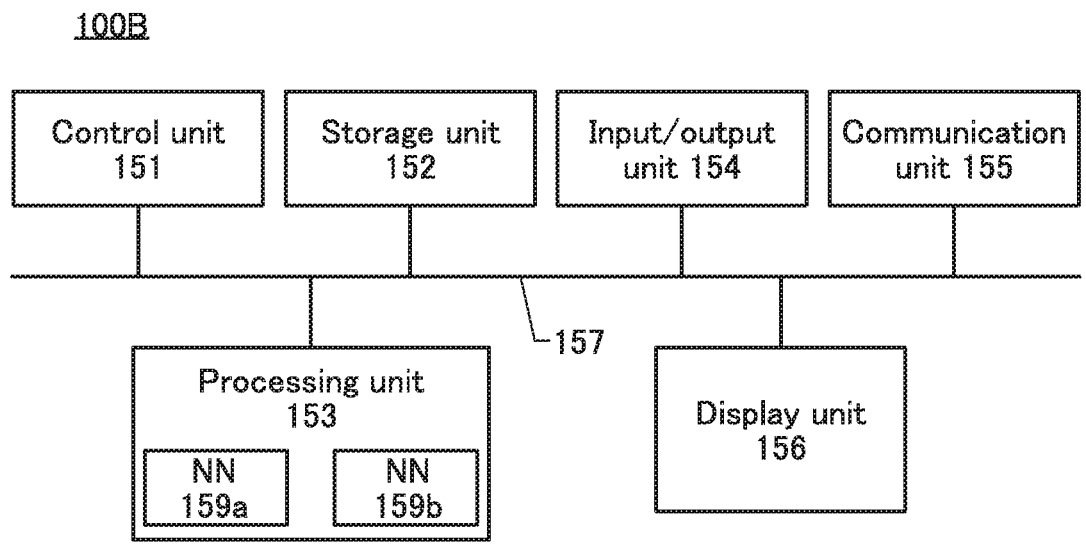
FIG. 4 Diagrams illustrating examples of a display system.

FIG. 4(A) illustrates a block diagram of a display system 100B.

The processing unit 153 may include a plurality of neural networks. In the display system 100B, the processing unit 153 includes a neural network 159a and a neural network 159b.

Generation of the image signal S2 and the correction signal W2 in the display system 100B is described with reference to FIG. 4(B) and FIG. 4(C).

The communication unit 155 supplies the image signal S1 based on data received from the outside to the processing unit 153. The processing unit 153 performs image processing on data included in the image signal S1 using the neural network 159a to generate the image signal S2. In addition, the processing unit 153 generates the correction signal W2 by using the neural network 159b and the data included in the image signal S1. The image signal S2 and the correction signal W2 are supplied from the processing unit 153 to the display unit 156.

Since the correction signal W2 is generated by using the image signal S1 in the display system 100B, high-quality up-conversion can be achieved as compared with the display system 100A. With the use of a deep neural network that has learned an enormous number of images as teacher data, for example, the correction signal W2 with high accuracy can be generated.

Pixel interpolation processing accompanying resolution up-conversion can be performed by using the correction signal W2. The pixel interpolation processing is processing of interpolating data that does not actually exist when resolution is up-converted. For example, with reference to pixels around the target pixel, data is interpolated so that an intermediate color of the pixels is displayed.

The processing unit 153 performs image processing on the image signal S1 without up-conversion of the image signal S1 to generate the image signal S2. Accordingly, the amount of arithmetic operation of the image processing can be reduced even when the correction signal W2 is generated in real time. When the image signal S2 is generated in parallel with the correction signal W2, display delay can be inhibited.

Figure 4B:
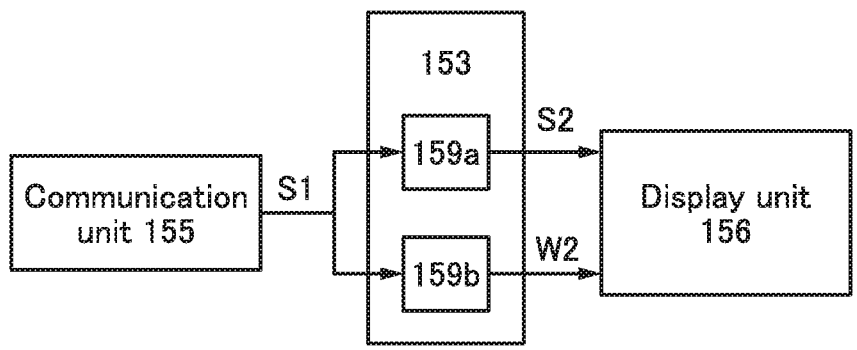
Figure 4C:
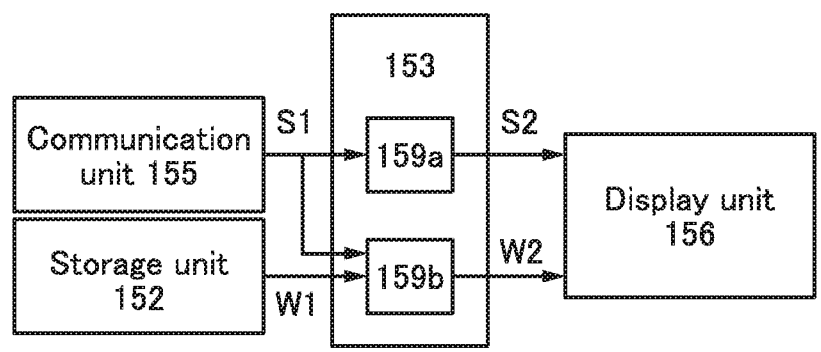

FIG. 4(B) illustrates an example in which only the image signal S1 is supplied to the neural network 159b. FIG. 4(C) illustrates an example in which the correction data W1 as well as the image signal S1 is supplied to the neural network 159b. The correction signal W2 generated by using the image signal S1 and the correction data W1 is added to the image signal S2, whereby up-conversion of an image and correction of display unevenness due to characteristic variation of the transistors included in the pixels can be performed, for example.

Modification examples of generation of the image signal S2 and the correction signal W2 in the display system of this embodiment are described with reference to FIG. 5(A) to FIG. 5(F).

Figure 5A:
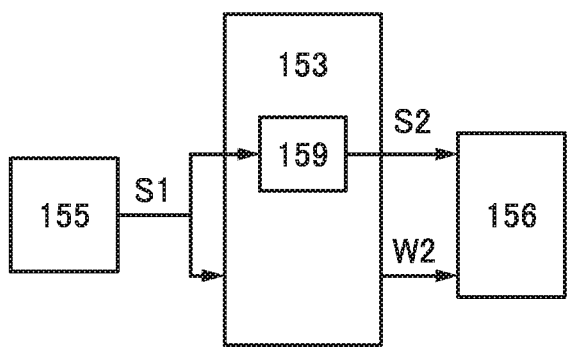
FIG. 5 Diagrams illustrating examples of a display system.
Figure 5B:
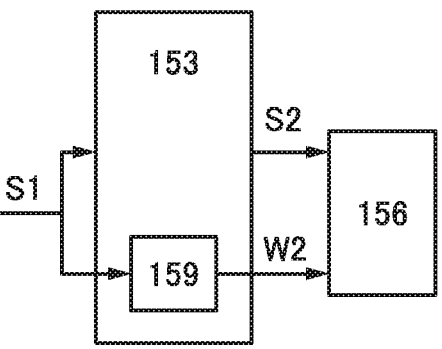
Figure 5C:
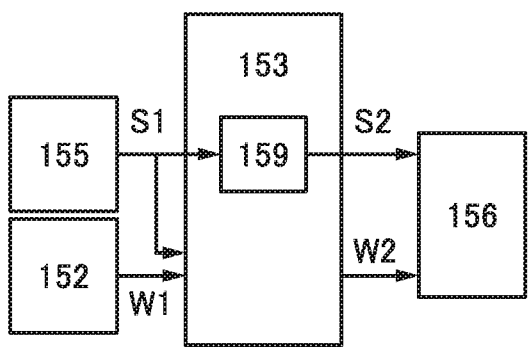
Figure 5D:
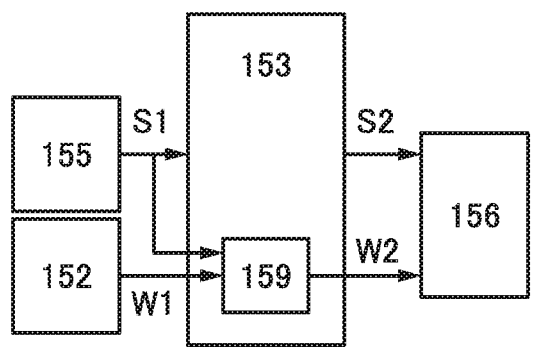

In the case where the image signal S2 and the correction signal W2 are generated by using the image signal S1, the neural network 159 may be used only for generation of the image signal S2 as illustrated in FIG. 5(A), or the neural network 159 may be used only for generation of the correction signal W2 as illustrated in FIG. 5(B). Signal generation without using the neural network 159 may be performed by another method utilizing artificial intelligence or may be performed by a method not utilizing artificial intelligence. The same applies to the cases where the correction signal W2 is generated by using the image signal S1 and the correction data W1 as illustrated in FIG. 5(C) and FIG. 5(D).

Figure 5E:
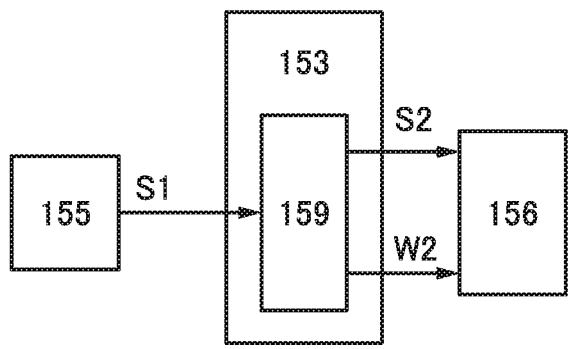
Figure 5F:
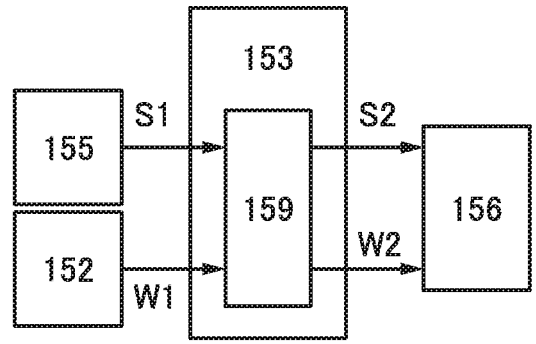

As illustrated in FIG. 5(E) and FIG. 5(F), the image signal S2 and the correction signal W2 are generated at the same time using one neural network 159. In that case, both data of the image signal S2 and data of the correction signal W2 are output from an output layer of the neural network. Data of the image signal S1 is input to an input layer of the neural network in FIG. 5(E). Both the data of the image signal S1 and the correction data W1 are input to the input layer of the neural network in FIG. 5(F).

In one embodiment of the present invention, the resolution of data included in an image signal is not changed by image processing and the resolution of an image is increased by generating a new image signal in a pixel to which a correction signal in addition to the image signal is supplied; thus, the amount of arithmetic operation can be reduced, power consumption can be reduced, the circuit scale can be reduced, or display delay can be inhibited, for example. Accordingly, a display system with high resolution or high display quality can be achieved. Furthermore, an increase in size and a reduction in power consumption of a display system can be achieved. Moreover, as described later, the operation for generating a new image signal in a pixel can be performed with a small number of steps and thus can be performed even in a display device that has a large number of pixels and a short horizontal period. Thus, a display system capable of operating at a high frame frequency can be achieved.

Next, components of the display system are described. Although the display system 100A is described below as an example, a similar structure can be applied to the display system 100B.

[Control Unit 151]

The control unit 151 (Controller) has a function of controlling the operation of the whole display system 100A. The control unit 151 controls the operations of the storage unit 152, the processing unit 153, the input/output unit 154, the communication unit 155, the display unit 156, and the like.

[Storage Unit 152]

As the storage unit 152, a memory device using a non-volatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Furthermore, a memory media drive such as a hard disk drive (HDD) or a solid state drive (SSD) may be used, for example.

A memory device which can be connected and disconnected through the input/output unit 154 with a connector, such as an HDD or an SSD, or a media drive for a recording medium such as a flash memory, a Blu-ray disc, or a DVD can be used as the storage unit 152. Note that the storage unit 152 is not incorporated in the display system 100A, and a memory device located outside the display system 100A may be used as the storage unit 152. In that case, the storage unit 152 is connected to the display system 100A through the input/output unit 154. Alternatively, a structure may be employed in which data transmission and reception are wirelessly performed through the communication unit 155.

A program, an algorithm, a weight coefficient, or the like used in the processing unit 153 is stored in the storage unit 152. In addition, video data or the like to be displayed on the display unit 156 is stored in the storage unit 152. The correction data W1 may be stored in the storage unit 152.

[Processing Unit 153]

The processing unit 153 has a function of executing an arithmetic operation associated with the operation of the whole display system 100A, and a central processing unit (CPU) or the like can be used, for example.

A CPU and other microprocessors such as a DSP (Digital Signal Processor) and a GPU (Graphics Processing Unit) can be used alone or in combination as the arithmetic unit 153. Such a microprocessor may be obtained with a PLD (Programmable Logic Device) such as an FPGA (Field Programmable Gate Array) or an FPAA (Field Programmable Analog Array).

The processing unit 153 includes the neural network 159 (also denoted by NN 159 in drawings). The neural network 159 may be formed using software.

The processing unit 153 interprets and executes instructions from various programs with the use of a processor to process various kinds of data and control programs. Programs that might be executed by the processor may be stored in a memory region of the processor or may be stored in the storage unit 152.

The processing unit 153 may include a main memory. The main memory can have a structure in which a volatile memory such as a RAM (Random Access Memory) or a nonvolatile memory such as a ROM (Read Only Memory) is provided.

For example, a DRAM is used for the RAM provided in the main memory, in which case a memory space as a workspace for the processing unit 153 is virtually allocated and used. An operating system, an application program, a program module, program data, and the like which are stored in the storage unit 152 are loaded into the RAM to be executed. The data, program, and program module which are loaded into the RAM are directly accessed and operated by the processing unit 153.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. As the EPROM, a UV-EPROM (Ultra-Violet Erasable Programmable Read Only Memory) which can erase stored data by ultraviolet irradiation, an EEPROM (Electrically Erasable Programmable Read Only Memory), a flash memory, and the like, can be given.

When arithmetic operation of the processing unit 153 is performed by hardware, an arithmetic circuit including a transistor containing silicon or an oxide semiconductor in a channel formation region is suitable. For example, an arithmetic circuit including a transistor containing silicon (amorphous silicon, low-temperature polysilicon, or single crystal silicon) or an oxide semiconductor in a channel formation region is suitable. In the case where product-sum operation is performed by the processing unit 153, a transistor containing an oxide semiconductor is suitable for a transistor included in a product-sum operation circuit; the details will be described in Embodiment 2.

[Input/Output Unit 154]

Examples of the input/output unit 154 include an external port to which another input component can be connected. The input/output unit 154 is electrically connected to the processing unit 153 through the bus line 157.

The external port can be connected to an external device such as a computer or a printer through a cable, for example. A USB terminal is a typical example. As the external port, a LAN (Local Area Network) connection terminal, a digital broadcast-receiving terminal, an AC adaptor connection terminal, or the like may be provided. Without limitation to wire communication, a transceiver for optical communication using infrared rays, visible light, ultraviolet rays, or the like may be provided.

[Communication Unit 155]

The communication unit 155 controls a control signal for connecting the display system 100A to a computer network in response to an instruction from the control unit 151 and transmits the signal to the computer network, for example. The display system 100A may be provided with an antenna so that communication may be performed via the antenna.

The communication can be performed by the communication unit 155 in such a manner that the display system 100A is connected to a computer network such as the Internet that is an infrastructure of the World Wide Web (WWW), an intranet, an extranet, a PAN (Personal Area Network), a LAN, a CAN (Campus Area Network), a MAN (Metropolitan Area Network), a WAN (Wide Area Network), or a GAN (Global Area Network). In the case of using a plurality of different communication methods, a plurality of antennas may be provided depending on the communication methods.

The communication unit 155 is provided with a high frequency circuit (RF circuit), for example, to transmit and receive an RF signal. The high frequency circuit is a circuit for performing conversion between an electromagnetic signal and an electric signal in a frequency band that is set by national laws to perform wireless communication with another communication apparatus using the electromagnetic signal. As a practical frequency band, several tens of kilohertz to several tens of gigahertz are generally used. A structure can be employed in which the high frequency circuit includes a circuit portion compatible with a plurality of frequency bands and the circuit portion includes an amplifier, a mixer, a filter, a DSP, an RF transceiver, or the like. In the case of performing wireless communication, it is possible to use, as a communication protocol or a communication technology, a communication standard such as LTE (Long Term Evolution), GSM (Global System for Mobile Communication: registered trademark), EDGE (Enhanced Data Rates for GSM Evolution), CDMA 2000 (Code Division Multiple Access 2000), or WCDMA (Wideband Code Division Multiple Access: registered trademark), or a communication standard developed by IEEE such as Wi-Fi (registered trademark), Bluetooth (registered trademark), or ZigBee (registered trademark). Alternatively, the third-generation mobile communication system (3G), the fourth-generation mobile communication system (4G), or the fifth-generation mobile communication system (5G) defined by the International Telecommunication Union (ITU) or the like can be used.

The communication unit 155 may have a function of connecting the display system 100A to a telephone line. In the case of making a phone call through a telephone line, the communication unit 155 controls a connection signal for connecting the display system 100A to the telephone line in response to an instruction from the control unit 151 and transmits the signal to the telephone line.

The communication unit 155 may include a tuner for generating an image signal, which is to be output to the display unit 156, from received airwaves. The tuner can have a structure including, for example, a demodulation circuit, an A-D converter circuit (analog-digital converter circuit), a decoder circuit, and the like. The demodulation circuit has a function of demodulating an input signal. The A-D converter circuit has a function of converting the demodulated analog signal into a digital signal. The decoder circuit has a function of decoding video data contained in the digital signal and generating an image signal.

A structure may be employed in which the decoder includes a dividing circuit and a plurality of processors. The dividing circuit has a function of dividing input video data spatiotemporally and outputting it to each of the processors. The plurality of processors decode the input video data and generate image signals. Since the decoder employs a structure in which the plurality of processors perform parallel data processing, video data containing an enormous amount of information can be decoded. In particular, in the case of displaying an image with a resolution higher than the full high definition, the decoder circuit for decoding compressed data preferably includes a processor having extremely high-speed processing capability. The decoder circuit preferably has a structure including a plurality of processors capable of performing 4 or more, preferably 8 or more, further preferably 16 or more processings in parallel, for example. The decoder may include a circuit for separating a signal that is used for an image and contained in the input signal from other signals (e.g., text data, broadcast program data, and certification data).

As airwaves the communication unit 155 can receive, ground waves, waves transmitted from a satellite, and the like can be given. Furthermore, as airwaves that the communication unit 155 can receive, airwaves for analog broadcasting, digital broadcasting, image-and-sound broadcasting, sound broadcasting, and the like can be given. For example, airwaves transmitted in a certain frequency band in a UHF band (approximately 300 MHz to 3 GHz) or a VHF band (30 MHz to 300 MHz) can be received. With the use of a plurality of pieces of data received in a plurality of frequency bands, for example, the transfer rate can be increased and more information can thus be obtained. Accordingly, the display unit 156 can display an image with a resolution higher than the full high definition. For example, an image with a resolution of 4K, 8K, 16K, or higher can be displayed.

Alternatively, the tuner may be configured to generate an image signal using broadcasting data transmitted with a data transmission technology via a computer network. In the case where the received signal is a digital signal, the tuner does not necessarily include the demodulation circuit and the A-D converter circuit.

The image signal obtained in the communication unit 155 can be stored in the storage unit 152.

The input/output unit 154 or the communication unit 155 may have a function of acquiring correction data. Correction data generated by an external device can be acquired and stored in the storage unit 152. Accordingly, correction data in the display system can be updated whenever necessary, leading to an improvement in the display quality.

[Display Unit 156]

A variety of display devices and display elements can be applied to the display unit 156. For example, a light-emitting display device, a liquid crystal display device, or the like can be used. In a light-emitting display device, an EL (Electro Luminescence) element (an organic EL element, an inorganic EL element, or an EL element containing an organic material and an inorganic material), an LED (Light Emitting Diode), or the like can be used as a display element. In a liquid crystal display device, a liquid crystal element can be used as a display element.

Figure 6:
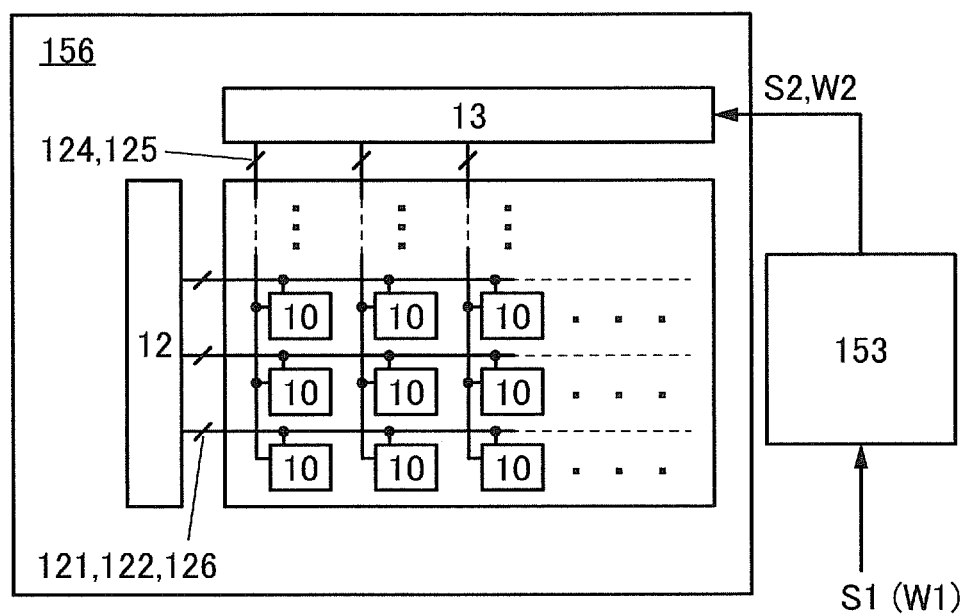
FIG. 6 A block diagram illustrating an example of a display unit.

FIG. 6 illustrates an example of a block diagram of the display unit 156.

The display unit 156 includes a plurality of pixels 10, a scan line driver circuit 12, and a signal line driver circuit 13. The plurality of pixels 10 are arranged in a matrix.

As the scan line driver circuit 12 and the signal line driver circuit 13, shift register circuits can be used, for example.

The image signal S2 and the correction signal W2 are supplied from the processing unit 153 to the signal line driver circuit 13. The processing unit 153 generates the image signal S2 and the correction signal W2 by using the supplied image signal S1 (and correction data W1).

<Configuration Example 1 of Pixel>

Next, configuration examples and operation examples of a pixel including a light-emitting element are described with reference to FIG. 7 to FIG. 10.

Figure 7:
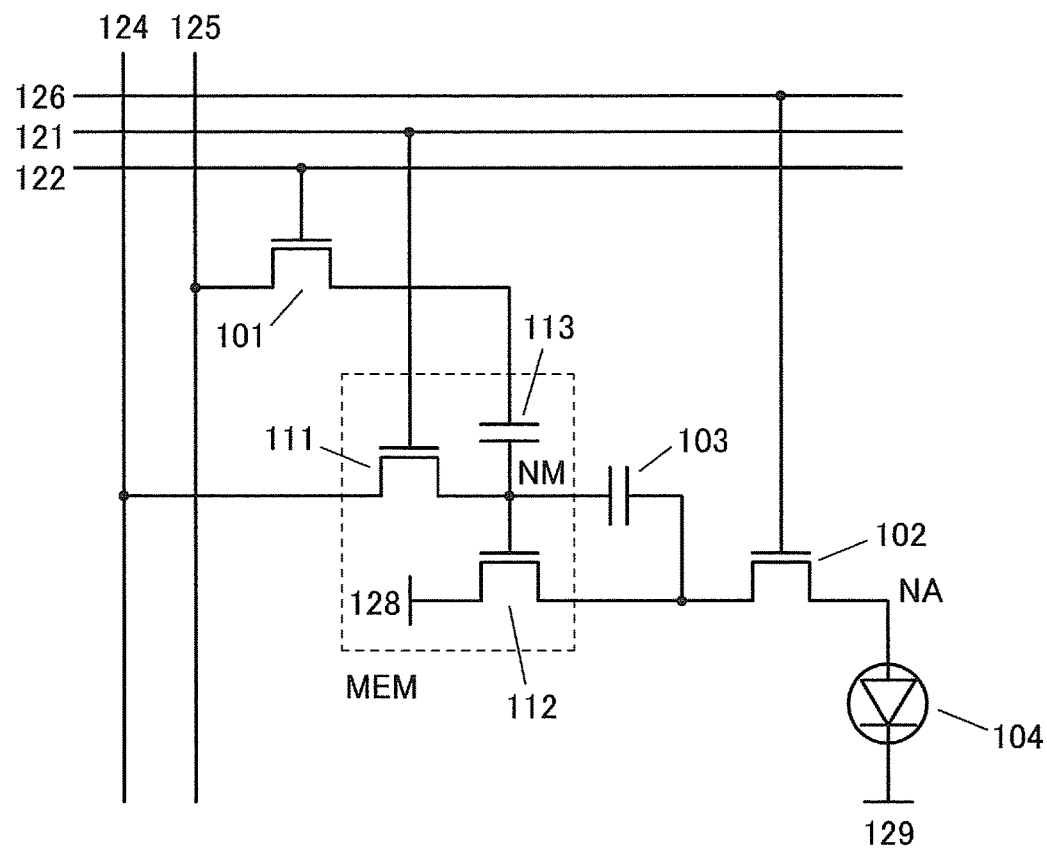
FIG. 7 A diagram illustrating an example of a pixel.

FIG. 7 illustrates a circuit diagram of a pixel 10a.

The pixel 10a includes a transistor 101, a transistor 102, a transistor 111, a transistor 112, a capacitor 103, a capacitor 113, and a light-emitting element 104.

One of a source and a drain of the transistor 101 is electrically connected to one electrode of the capacitor 113. The other electrode of the capacitor 113 is electrically connected to one of a source and a drain of the transistor 111. The one of the source and the drain of the transistor 111 is electrically connected to a gate of the transistor 112. The gate of the transistor 112 is electrically connected to one electrode of the capacitor 103. The other electrode of the capacitor 103 is electrically connected to one of a source and a drain of the transistor 112. The one of the source and the drain of the transistor 112 is electrically connected to one of a source and a drain of the transistor 102. The other of the source and the drain of the transistor 102 is electrically connected to one electrode of the light-emitting element 104.

Here, a node at which the other electrode of the capacitor 113, the one of the source and the drain of the transistor 111, the gate of the transistor 112, and the one electrode of the capacitor 103 are connected is referred to as a node NM. A node at which the other of the source and the drain of the transistor 102 and the one electrode of the light-emitting element 104 are connected is referred to as a node NA.

A gate of the transistor 101 is electrically connected to a wiring 122. A gate of the transistor 102 is electrically connected to a wiring 126. A gate of the transistor 111 is electrically connected to a wiring 121. The other of the source and the drain of the transistor 101 is electrically connected to a wiring 125. The other of the source and the drain of the transistor 111 is electrically connected to a wiring 124.

The other of the source and the drain of the transistor 112 is electrically connected to a power supply line 128 (high potential). The other electrode of the light-emitting element 104 is electrically connected to a common wiring 129. Note that a given potential can be supplied to the common wiring 129.

The wirings 121, 122, and 126 can each have a function of a signal line for controlling the operation of the transistors. The wiring 125 can have a function of a signal line for supplying image data to the pixel 10a. The wiring 124 can have a function of a signal line for writing data to a memory circuit MEM. The wiring 124 can have a function of a signal line for supplying a correction signal to the pixel 10a.

The transistor 111, the transistor 112, and the capacitor 113 form the memory circuit MEM. The node NM is a memory node; when the transistor 111 is turned on, a signal supplied to the wiring 124 can be written into the node NM. The use of a transistor with an extremely low off-state current as the transistor 111 enables the potential of the node NM to be retained for a long time.

As the transistor 111, a transistor containing a metal oxide in its channel formation region (hereinafter, an OS transistor) can be used, for example. Thus, the off-state current of the transistor 111 can be extremely low, and the potential of the node NM can be retained for a long time. In this case, OS transistors are preferably used as the other transistors included in the pixel.

A transistor containing Si in its channel formation region (hereinafter, a Si transistor) may also be used as the transistor 111. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

When an EL element or a reflective liquid crystal element is used as the display element, a silicon substrate can be used; thus, a Si transistor and an OS transistor can be formed to have a region overlapping with each other. Thus, the pixel density can be increased even when the number of transistors is relatively large.

As a semiconductor material used for an OS transistor, a metal oxide with an energy gap of 2 eV or more, preferably 2.5 eV or more, further preferably 3 eV or more can be used. A typical example thereof is an oxide semiconductor containing indium, and a CAAC-OS (C-Axis Aligned Crystalline Oxide Semiconductor or C-Axis Aligned and A-B-plane Anchored Crystalline Oxide Semiconductor) or a CAC (Cloud-Aligned Composite)-OS described later can be used, for example. A CAAC-OS is suitable for a transistor that emphasizes the reliability, for example, because of the stability of atoms composing crystals therein. A CAC-OS exhibits excellent mobility characteristics and thus is suitable for a transistor that operates at high speed, for example.

An OS transistor has a large energy gap and thus exhibits an extremely low off-state current. An OS transistor has the following feature different from that of a Si transistor: impact ionization, an avalanche breakdown, a short-channel effect, or the like does not occur and thus can configure a highly reliable circuit.

A semiconductor layer included in an OS transistor can be, for example, a film represented by an In-M-Zn-based oxide that contains indium, zinc, and M (a metal such as Al, Ti, Ga, Ge, Y, Zr, La, Ce, Sn, Nd, or Hf).

In the case where an oxide semiconductor included in the semiconductor layer is an In-M-Zn-based oxide, it is preferable that the atomic ratio of metal elements of a sputtering target used to deposit the In-M-Zn oxide satisfy In≥M and Zn≥M The atomic ratio of the metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the deposited semiconductor layer varies from the above atomic ratios of the metal elements of the sputtering target in a range of ±40%.

An oxide semiconductor with a low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and thus can be regarded as an oxide semiconductor having stable characteristics.

Note that the composition is not limited to the above, and a material with an appropriate composition may be used depending on required semiconductor characteristics and electrical characteristics (field-effect mobility, threshold voltage, and the like) of a transistor. In order that the required semiconductor characteristics of the transistor can be obtained, it is preferable that the carrier density, the impurity concentration, the defect density, the atomic ratio of a metal element to oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal sometimes generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor that contains nitrogen is likely to have normally-on characteristics. Hence, the concentration of nitrogen (concentration measured by secondary ion mass spectrometry) in the semiconductor layer is preferably set to lower than or equal to $5\times10^{18}$ atoms/cm$^3$.

The semiconductor layer may have a non-single-crystal structure, for example. Examples of the non-single-crystal structure include a CAAC-OS including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The structure of the CAC-OS will be described in detail in Embodiment 5.

In the pixel 10a, a signal written to the node NM is capacitively coupled with an image signal supplied from the wiring 125 and can be output to the node NA. Note that the transistor 101 can have a function of selecting a pixel. The transistor 102 can have a function of a switch that controls light emission of the light-emitting element 104.

For example, when the signal written to the node NM from the wiring 124 is higher than the threshold voltage ($V_{th}$) of the transistor 112, the transistor 112 is turned on before the image signal is written, and thus, the light-emitting element 104 emits light. For this reason, it is preferred that the transistor 102 be provided and the transistor 102 be turned on after the potential of the node NM is fixed, so that the light-emitting element 104 emits light.

In other words, when a desired correction signal is stored in the node NM in advance, the correction signal can be added to the supplied image signal. Note that the correction signal is sometimes attenuated by a component on a transmission path and thus is preferably generated in consideration of the attenuation.

Figure 8A:
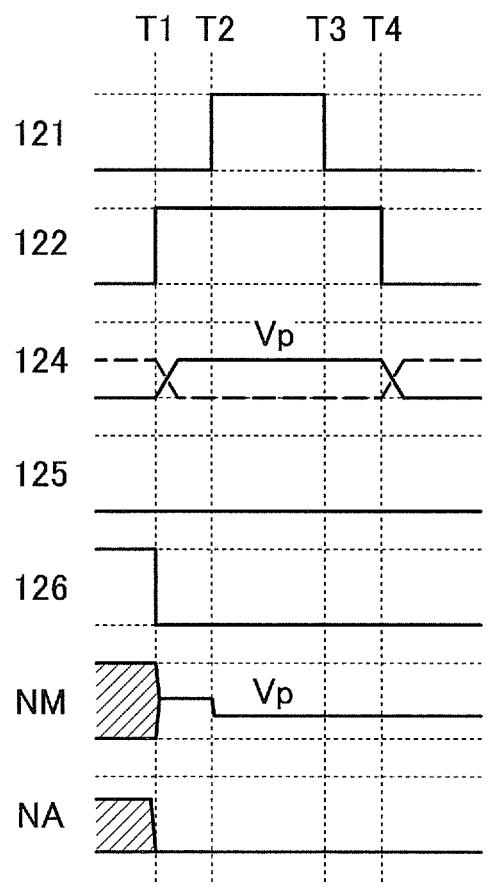
FIG. 8 Timing charts showing operation examples of a pixel.
Figure 8B:
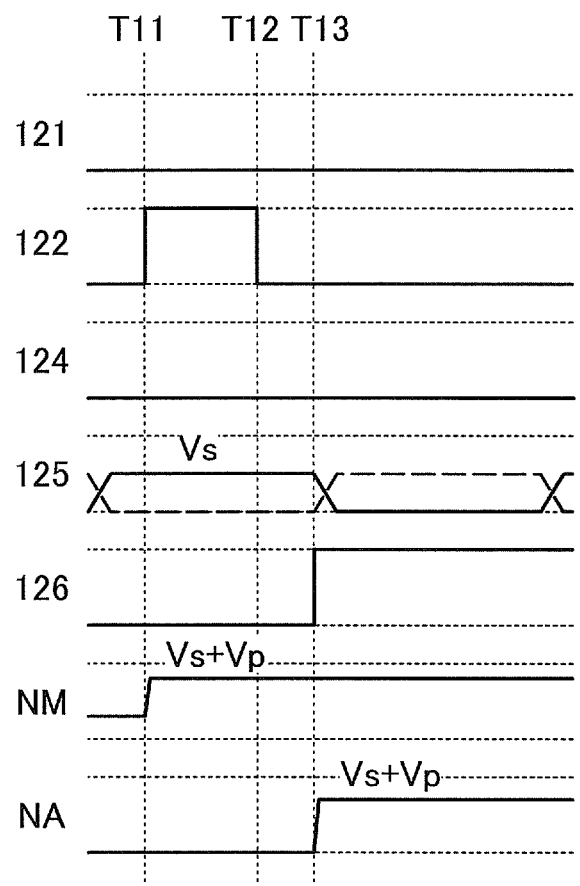

The operation of the pixel 10a is described in detail with reference to timing charts shown in FIG. 8(A) and FIG. 8(B). Although a given positive or negative signal can be used as a correction signal (Vp) supplied to the wiring 124, the case where a positive signal is supplied is described here. In the following description, a high potential is represented by "H", and a low potential is represented by "L".

First, operation of writing the correction signal (Vp) to the node NM is described with reference to FIG. 8(A). Note that in the case where the purpose is up-conversion, it is usually preferred that the operation be performed frame by frame. In the case of a display system that has a function of generating the correction signal W2 by using the image signal S1 as in FIG. 4(B) or FIG. 4(C), for example, the operation is performed frame by frame.

In the case of the a display system that has a function of generating the correction signal W2 without using the image signal S1 as in FIG. 1(B), the operation does not need to be performed frame by frame, and writing needs to be performed at least once before the image signal S2 is supplied. Refresh operation may be performed as appropriate to rewrite the same correction signal W2 to the node NM.

At time T1, the potential of the wiring 121 is set to "L", the potential of the wiring 122 is set to "H", the potential of the wiring 125 is set to "L", and the potential of the wiring 126 is set to "L", so that the transistor 101 is turned on and the potential of the other electrode of the capacitor 113 becomes "L".

The operation is reset operation for capacitive coupling operation that is to be performed later. Before the time T1, light-emitting operation of the light-emitting element 104 in the previous frame is performed; however, the reset operation changes the potential of the node NM, thereby changing the amount of current flowing through the light-emitting element 104; thus, the transistor 102 is preferably turned off to stop light emission of the light-emitting element 104.

At time T2, the potential of the wiring 121 is set to "H", the potential of the wiring 122 is set to "H", the potential of the wiring 125 is set to "L", and the potential of the wiring 126 is set to "L", so that the transistor 111 is turned on and the potential of the wiring 124 (correction signal (Vp)) is written to the node NM.

At time T3, the potential of the wiring 121 is set to "L", the potential of the wiring 122 is set to "H", the potential of the wiring 125 is set to "L", and the potential of the wiring 126 is set to "L", so that the transistor 111 is turned off and the correction signal (Vp) is retained in the node NM.

At time T4, the potential of the wiring 121 is set to "L", the potential of the wiring 122 is set to "L", the potential of the wiring 125 is set to "L", and the potential of the wiring 126 is set to "L", so that the transistor 101 is turned off. Thus, the operation of writing the correction signal (Vp) is completed.

Next, operation of correcting an image signal (Vs) and operation of making the light-emitting element 104 emit light will be described with reference to FIG. 8(B).

At time T11, the potential of the wiring 121 is set to "L", the potential of the wiring 122 is set to "H", the potential of the wiring 124 is set to "L", and the potential of the wiring 126 is set to "L", so that the transistor 101 is turned on and the potential of the wiring 125 is added to the potential of the node NM by capacitive coupling of the capacitor 113. That is, the node NM has a potential obtained by adding the correction signal (Vp) to the image signal (Vs) (Vs+Vp).

At time T12, the potential of the wiring 121 is set to "L", the potential of the wiring 122 is set to "L", the potential of the wiring 124 is set to "L", and the potential of the wiring 126 is set to "L", so that the transistor 101 is turned off and the potential of the node NM is fixed to Vs+Vp.

At time T13, the potential of the wiring 121 is set to "L", the potential of the wiring 122 is set to "L", the potential of the wiring 124 is set to "L", and the potential of the wiring 126 is set to "H", so that the transistor 102 is turned on and the potential of the node NA becomes Vs+Vp; thus, the light-emitting element 104 emits light. Strictly speaking, the potential of the node NA is lower than Vs+Vp by the threshold voltage ($V_{th}$) of the transistor 112; here, the level of $V_{th}$ is as low as a negligible level.

The above is the operation of correcting the image signal (Vs) and the operation of making the light-emitting element 104 emit light. Note that the operation of writing the correction signal (Vp) described above and operation of inputting the image signal (Vs) may be successively performed but the operation of inputting the image signal (Vs) is preferably performed after the correction signal (Vp) is written to all the pixels. In one embodiment of the present invention, since the same image signal can be supplied to a plurality of pixels at a time, the operation speed can be increased by writing the correction signal (Vp) to all the pixels first.

The display system of one embodiment of the present invention has a structure of generating an image subjected to up-conversion in pixels. In the display system, an image signal supplied to a pixel is an image signal of a low resolution, and the same image signal is supplied to a plurality of pixels in some cases. In the example illustrated in FIG. 2(A) and FIG. 2(B), the same image signal is supplied to four pixels in the horizontal and vertical directions. In this case, the same image signal may be supplied to signal lines connected to the pixels, and electrically connecting the signal lines to which the same image signal is supplied allows the operation of writing the image signal to be performed at high speed.

Figure 9:
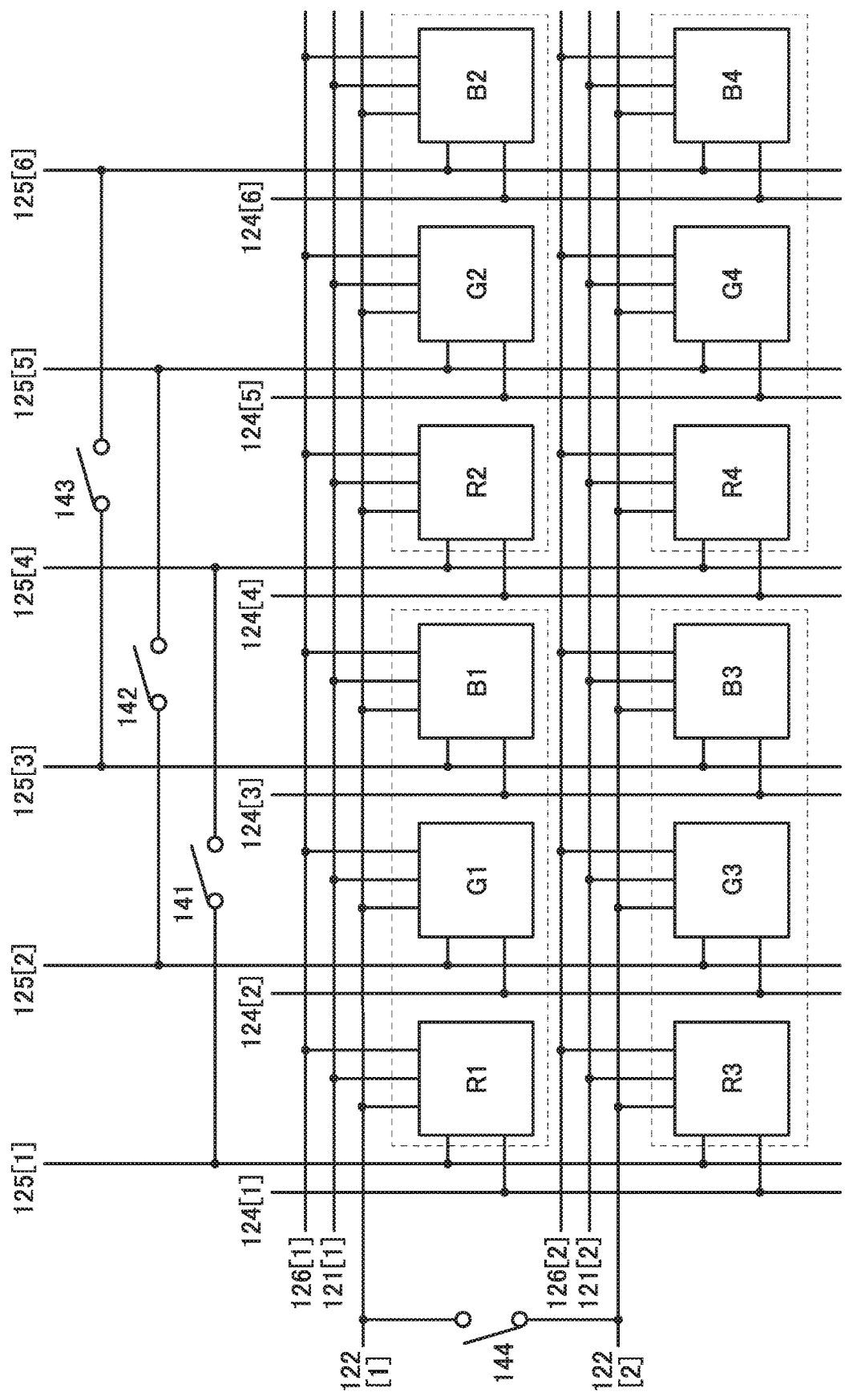
FIG. 9 A diagram illustrating an example of a display unit.

FIG. 9 is a diagram illustrating part of the display unit 156 capable of color display, and illustrates a structure in which signal lines that supply the same image signal can be electrically connected to each other through a switch. A pixel of a display device capable of color display generally includes a combination of subpixels that emit colors of red (R), green (G), and blue (B). FIG. 9 illustrates four pixels in the longitudinal and lateral directions: three subpixels of R, G, and B arranged in the lateral direction form one pixel.

Here, as illustrated in FIG. 2(A) and FIG. 2(B), the same image signal is input to four pixels in the longitudinal and lateral directions. In FIG. 9, the same image signal is supplied to pixels R1 to R4. For example, the same image signal is supplied to wirings 125[1] and 125[4] that are connected to the pixels R1 to R4 and function as signal lines and signals are sequentially input to wirings 122[1] and 122[2] that function as scan lines, whereby the same image signal can be input to all of the pixels. Note that the method is wasteful in supplying the same image signal to a plurality of pixels.

In one embodiment of the present invention, electrical conduction between signal lines is provided with a switch provided between the two signal lines and electrical conduction between scan lines is provided with a switch provided between the two scan lines, whereby writing to four pixels can be performed at a time.

As illustrated in FIG. 9, a switch 141 provided between the wiring 125[1] and the wiring 125[4] is turned on, whereby an image signal supplied to one of the wiring 125[1] and the wiring 125 [4] can be written to the pixel R1 and the pixel R2 simultaneously. At this time, a switch 144 provided between the wiring 122[1] and the wiring 122[2] is turned on so that the image signal can also be written to the pixel R3 and the pixel R4 at the same time. That is, simultaneous writing to the four pixels is possible.

Similarly, a switch 142 provided between a wiring 125[2] and a wiring 125[5] and a switch 143 provided between a wiring 125[3] and a wiring 125[6] are turned on as needed, whereby writing to other four pixels can be performed at a time. As the switches 141 to 144, transistors can be used, for example.

Simultaneous writing to four pixels enables a reduction in writing time and an increase in frame frequency.

Figure 10A:
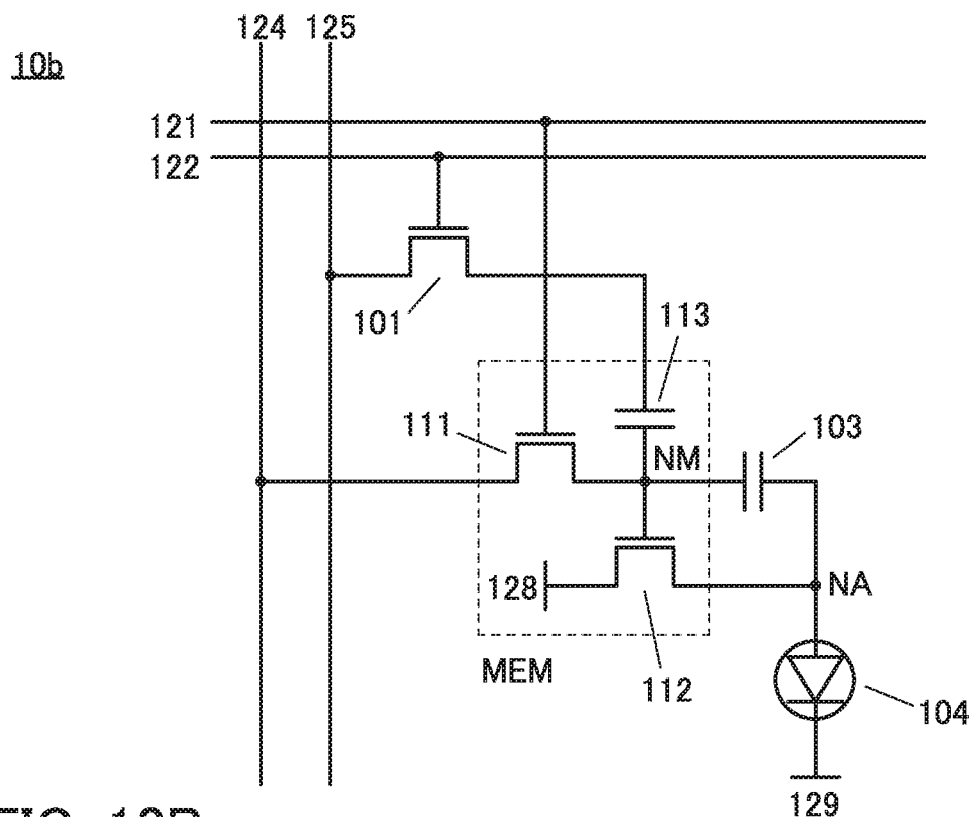
FIG. 10 Diagrams illustrating examples of a pixel.

A pixel 10b illustrated in FIG. 10(A) has a configuration obtained by omitting the transistor 102 from the pixel 10a illustrated in FIG. 7.

As described above, the transistor 102 is provided to solve a malfunction that occurs in the case where a signal to be written to the node NM is higher than or equal to the threshold voltage ($V_{th}$) of the transistor 112. Note that when the signal to be written to the node NM is set to a value lower than $V_{th}$, the transistor 102 can be omitted.

Figure 10B:
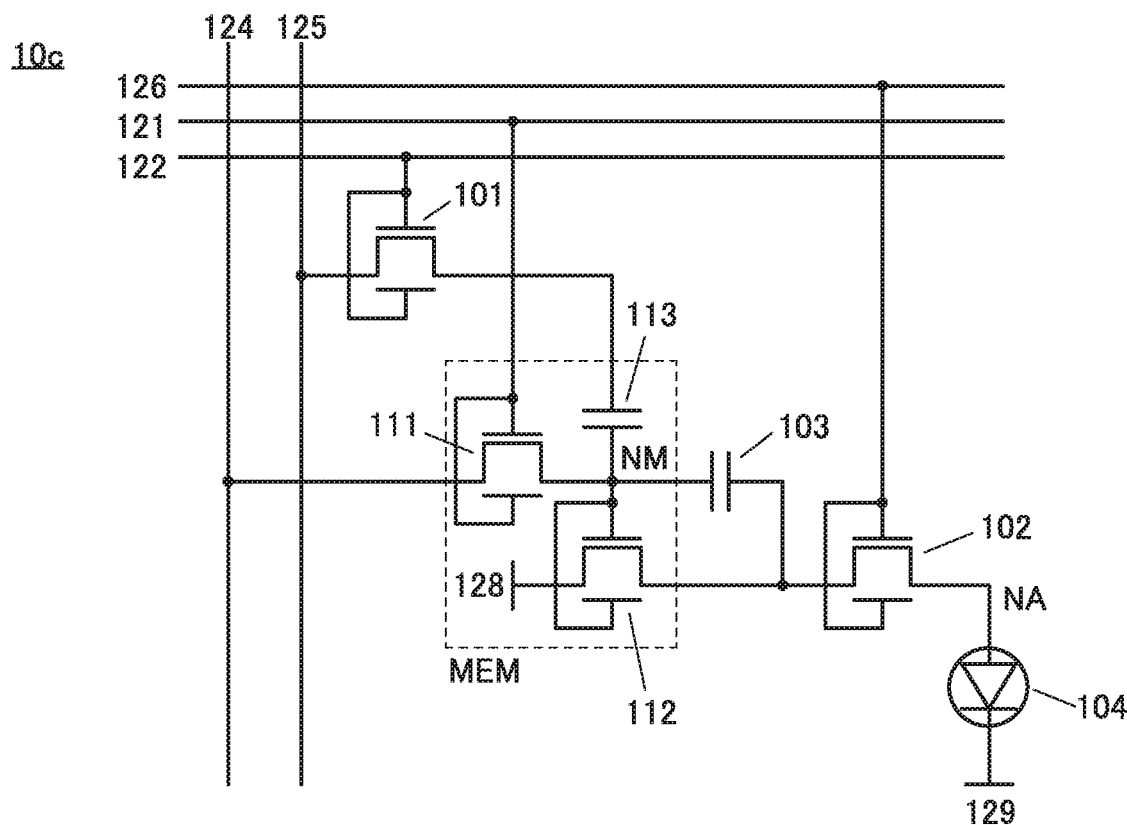

A pixel 10c illustrated in FIG. 10(B) has a configuration in which each transistor included in the pixel 10a illustrated in FIG. 7 is provided with a back gate. The back gate is electrically connected to a front gate and has an effect of increasing on-state current. Alternatively, a configuration may be employed in which a fixed potential which is different from that of the front gate can be supplied to the back gate. Such a configuration enables control of the threshold voltage of the transistor. Although FIG. 10(B) illustrates a configuration in which all of the transistors are provided with a back gate, a transistor not provided with a back gate may also be included. A structure of a transistor including a back gate is also effective for the other pixels in this embodiment.

<Structure Example 2 of Display System>

Generation of the image signal S2 and the correction signal W2 in the display system of this embodiment is described with reference to FIG. 11(A) and FIG. 11(B).

The processing unit 153 may generate the correction signal W2 by using a signal W3 supplied from the display unit 156. For example, the electrical characteristics of a transistor included in a pixel are obtained and the signal W3 based on them is supplied to the processing unit 153. When the correction signal W2 is generated by using the signal W3, display unevenness of the display unit 156 can be inhibited.

Figure 11A:
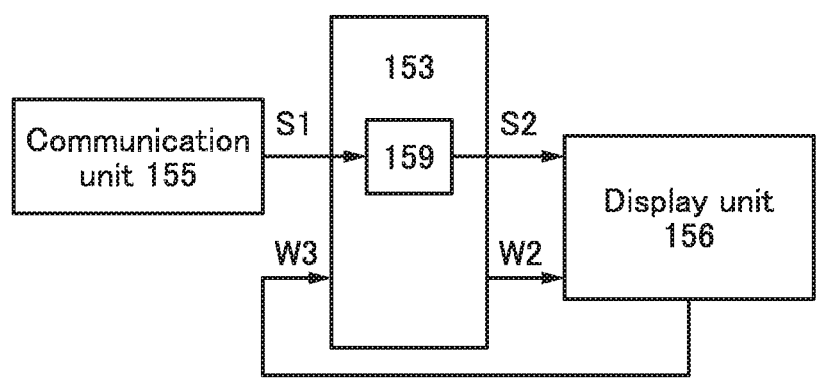
FIG. 11 Diagrams illustrating examples of a display system.
Figure 11B:
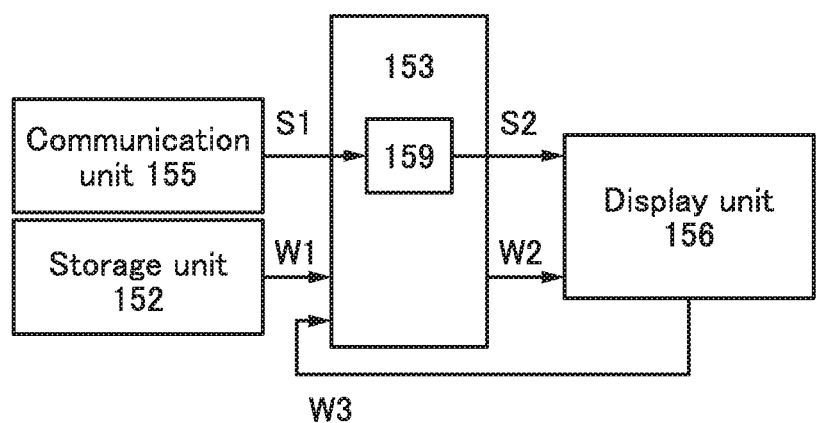

FIG. 11(A) illustrates an example in which the correction signal W2 is generated by using only the signal W3. FIG. 11(B) illustrates an example in which the correction signal W2 is generated by using, in addition to the signal W3, the correction data W1 supplied from the storage unit 152. The use of the correction data W1 enables image up-conversion in addition to the correction of display unevenness, for example.

Figure 12:
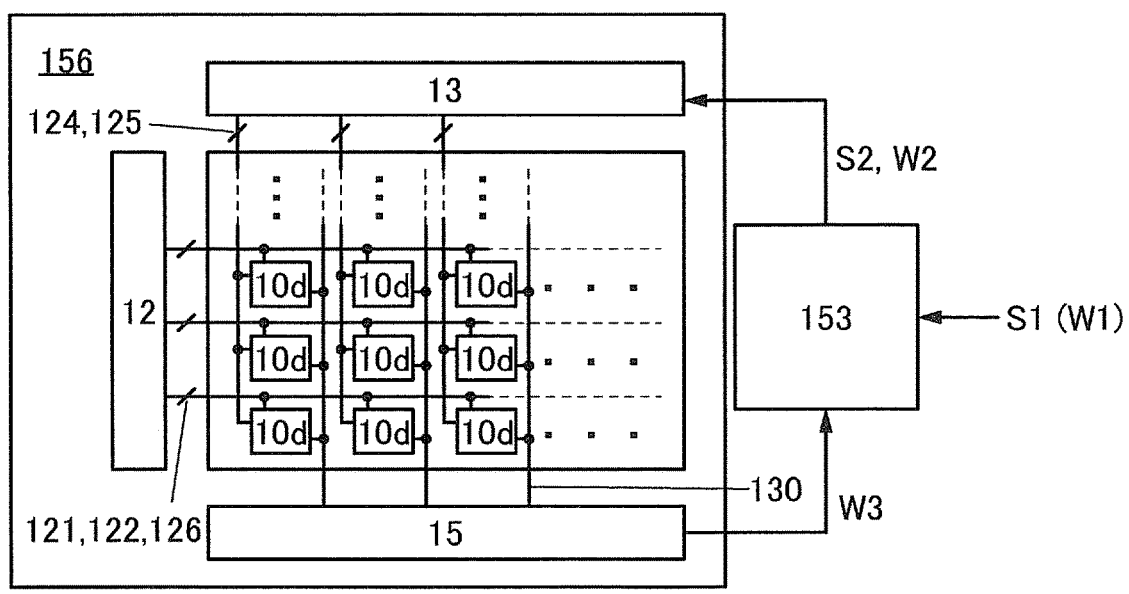
FIG. 12 A block diagram illustrating an example of a display unit.

FIG. 12 illustrates an example of a block diagram of the display unit 156.

The display unit 156 includes a plurality of pixels 10d, the scan line driver circuit 12, the signal line driver circuit 13, and a circuit 15. The plurality of pixels 10d are arranged in a matrix.

As the circuit 15, a shift register circuit can be used, for example. Wirings 130 are sequentially selected by the circuit 15, and the output value (the signal W3) can be input to the processing unit 153.

The image signal S1 is supplied to the processing unit 153. Furthermore, the correction data W1 may be supplied to the processing unit 153. As described above, the signal W3 is supplied from the circuit 15 to the processing unit 153.

The processing unit 153 has a function of generating the image signal S2 and the correction signal W2.

<Configuration Example 2 of Pixel>

Although the up-conversion operation in a pixel including the memory circuit MEM is mainly described in Configuration example 1 of pixel, operation for correcting variations in transistor characteristics can also be performed in the pixel. In the pixel using an EL element, variations in the threshold voltage of a driving transistor that supplies current to the EL element significantly affect the display quality. A signal for correcting the threshold voltage of the driving transistor is retained in the memory circuit MEM and added to an image signal, so that the display quality can be improved.

Figure 13:
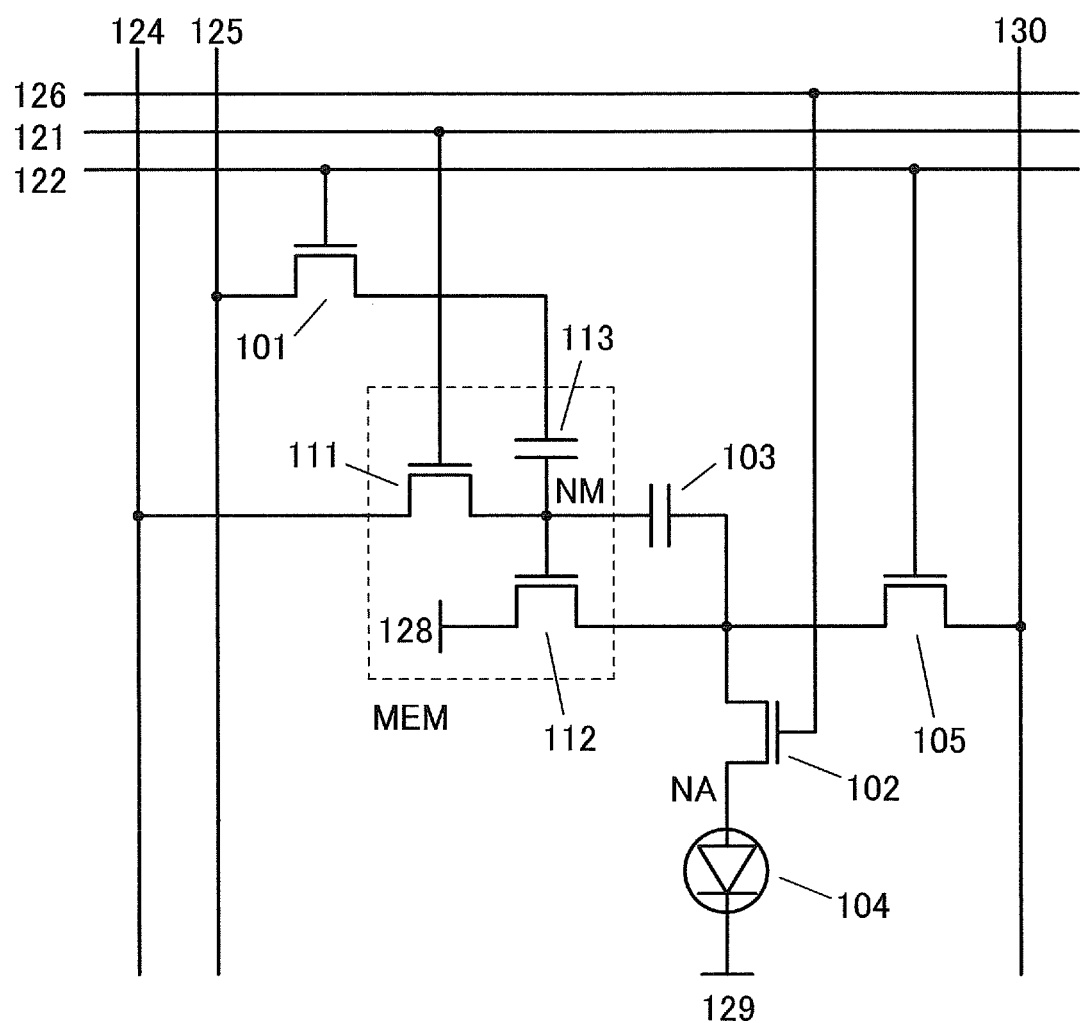
FIG. 13 A diagram illustrating an example of a pixel.

FIG. 13 is a circuit diagram illustrating a specific example of the pixel 10d illustrated in FIG. 12. The pixel 10d can perform the operation for correcting the threshold voltage ($V_{th}$) of the transistor 112.

The pixel 10d has a configuration obtained by adding a transistor 105 and the wiring 130 to the pixel 10a illustrated in FIG. 7. The use of the pixel with such a configuration enables correction of the threshold voltage of the transistor 112. Note that the up-conversion operation described above may be performed using the pixel with such a configuration. Both the operation of correcting threshold voltage and the up-conversion operation may be performed.

One of a source and a drain of the transistor 105 is electrically connected to the one of the source and the drain of the transistor 112. The other of the source and the drain of the transistor 105 is electrically connected to the wiring 130. A gate of the transistor 105 is electrically connected to the wiring 122.

The wiring 130 has a function of a monitor line for obtaining the electrical characteristics of the transistor 111. Supplying a specific potential from the wiring 130 to the one electrode of the capacitor 109 through the transistor 111 can stabilize writing of an image signal.

The pixel 10d performs operation for external correction as initial operation, and the generated correction signal is stored in the memory circuit MEM. Thus, after the correction signal is retained in the memory circuit MEM, operation is performed like internal correction.

Generation of the correction signal and storage of the correction signal in the memory circuit MEM are described with reference to FIG. 12 and FIG. 13.

First, the transistor 111 is turned on in order that a standard potential at which the transistor 112 is turned on can be written into the node NM. Current output from the transistor 112 is taken into the processing unit 153 through the transistor 105. This operation is performed in all the pixels, and the current values output from the transistors 112 when the standard potential is applied to their gates are obtained.

The processing unit 153 reads and analyzes the current values and generates the correction signal W2 to be stored in each pixel, on the basis of a transistor whose current value is a mean value or a median value. The correction signal W2 is input to the signal line driver circuit 13 and stored in the memory circuit MEM of each pixel. Note that a circuit having a function of reading current values and a circuit having a function of generating the correction signal W2 may be different from each other.

After that, display operation using the image signal to which the correction signal is added is performed like the up-conversion operation. Note that the threshold voltage of a transistor sometimes varies significantly over a long period but rarely varies in a short period. Thus, generation of a correction signal and storage in the memory circuit MEM do not need to be performed frame by frame and can be performed when power is turned on or operation terminates, for example. The operation time of the display unit 156 may be recorded so that the operation can be performed at regular intervals of days, weeks, months, years, or the like.

The correction signal W2 is generated by using the signal W3 and one or both of the image signal S1 and the correction data W1 supplied to the processing unit 153, whereby both operations of threshold voltage correction and up-conversion can be performed.

Although the method for generating the correction signal W2 by measuring the current value output from the transistor 112 is described above, the correction signal W2 may be generated by another method. For example, the correction signal W2 may be generated on the basis of data obtained by reading the luminance of grayscale display with a luminance meter or data obtained by reading a photograph of the display. For generation of the correction signal W2, inference using a neural network is preferably employed.

<Configuration Example 3 of Pixel>

Next, configuration examples and operation examples of a pixel including a liquid crystal element are described with reference to FIG. 14 to FIG. 17.

Figure 14:
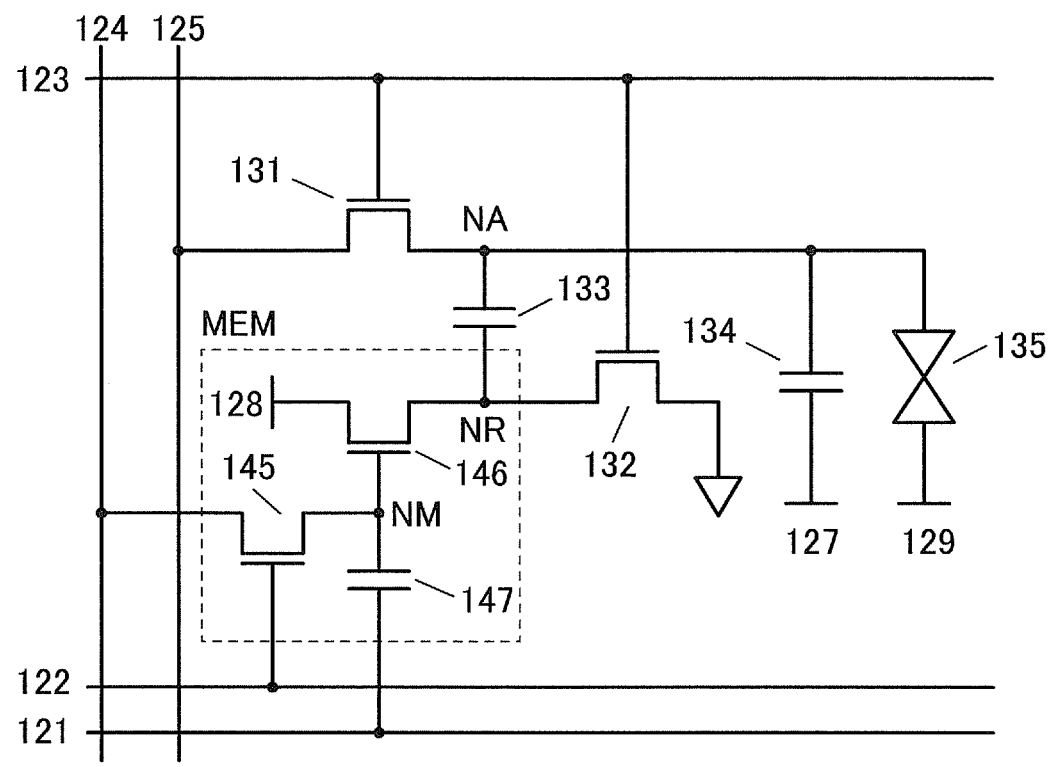
FIG. 14 A diagram illustrating an example of a pixel.

FIG. 14 illustrates a circuit diagram of a pixel 10e.

The pixel 10e includes a transistor 131, a transistor 132, a transistor 145, a transistor 146, a capacitor 133, a capacitor 134, a capacitor 147, and a liquid crystal element 135.

One of a source and a drain of the transistor 131 is electrically connected to one electrode of the capacitor 133. The one electrode of the capacitor 133 is electrically connected to one electrode of the capacitor 134. The one electrode of the capacitor 134 is electrically connected to one electrode of the liquid crystal element 135. One of a source and a drain of the transistor 132 is electrically connected to the other electrode of the capacitor 133. The other electrode of the capacitor 133 is electrically connected to one of a source and a drain of the transistor 146. A gate of the transistor 146 is electrically connected to one of a source and a drain of the transistor 145. The one of the source and the drain of the transistor 145 is electrically connected to one electrode of the capacitor 147.

Here, a node at which the one of the source and the drain of the transistor 131, the one electrode of the capacitor 133, the one electrode of the capacitor 134, and the one electrode of the liquid crystal element 135 are connected is referred to as the node NA. A node at which the other electrode of the capacitor 133, the one of the source and the drain of the transistor 132, and the one of the source and the drain of the transistor 146 are connected is referred to as a node NR. A node at which the gate of the transistor 146, the one of the source and the drain of the transistor 145, and the one electrode of the capacitor 147 are connected is referred to as the node NM.

A gate of the transistor 131 is electrically connected to a wiring 123. A gate of the transistor 132 is electrically connected to the wiring 123. The other of the source and the drain of the capacitor 147 is electrically connected to the wiring 121. A gate of the transistor 145 is electrically connected to the wiring 122. The other of the source and the drain of the transistor 145 is electrically connected to the wiring 124.

The other of the source and the drain of the transistor 146 is electrically connected to the power supply line 128 (high potential). The other of the source and the drain of the transistor 132 is electrically connected to a power supply line (low potential). The other electrode of the capacitor 134 is electrically connected to a common wiring 127. The other electrode of the liquid crystal element 135 is electrically connected to the common wiring 129. Note that the common wirings 127 and 129 can be supplied with a given potential, and may be electrically connected to each other.

The wirings 122 and 123 can each have a function of a signal line for controlling the operation of the transistors. The wiring 125 can have a function of a signal line for supplying image data to the pixel 10e. The wiring 121 and the wiring 124 can have a function of a signal line for operating the memory circuit MEM. The wiring 124 can have a function of a signal line for supplying a correction signal to the pixel 10e.

The transistor 145, the transistor 146, and the capacitor 147 form the memory circuit MEM. The node NM is a memory node; when the transistor 145 is turned on, a signal supplied to the wiring 124 can be written into the node NM. The use of a transistor with an extremely low off-state current as the transistor 145 enables the potential of the node NM to be retained for a long time.

As the transistor 145, an OS transistor can be used, for example. Thus, the off-state current of the transistor 145 can be extremely low, and the potential of the node NM can be retained for a long time. In this case, OS transistors are preferably used as the other transistors included in the pixel.

A Si transistor may also be used as the transistor 145. In this case, Si transistors are preferably used as the other transistors included in the pixel.

One pixel may include both an OS transistor and a Si transistor.

In the pixel 10e, a signal written into the node NM can be read out to the node NR when an appropriate potential is supplied to the wiring 121. The potential can be, for example, a potential corresponding to the threshold voltage of the transistor 146. In the case where an image signal has been written into the node NA before this operation, a signal potential obtained by adding the potential of the node NR to the image signal is applied to the liquid crystal element 135 owing to capacitive coupling of the capacitor 133.

In other words, when a desired correction signal is stored in the node NM in advance, the correction signal can be added to the supplied image signal. Note that the correction signal is sometimes attenuated by a component on a transmission path and thus is preferably generated in consideration of the attenuation.

Figure 15:
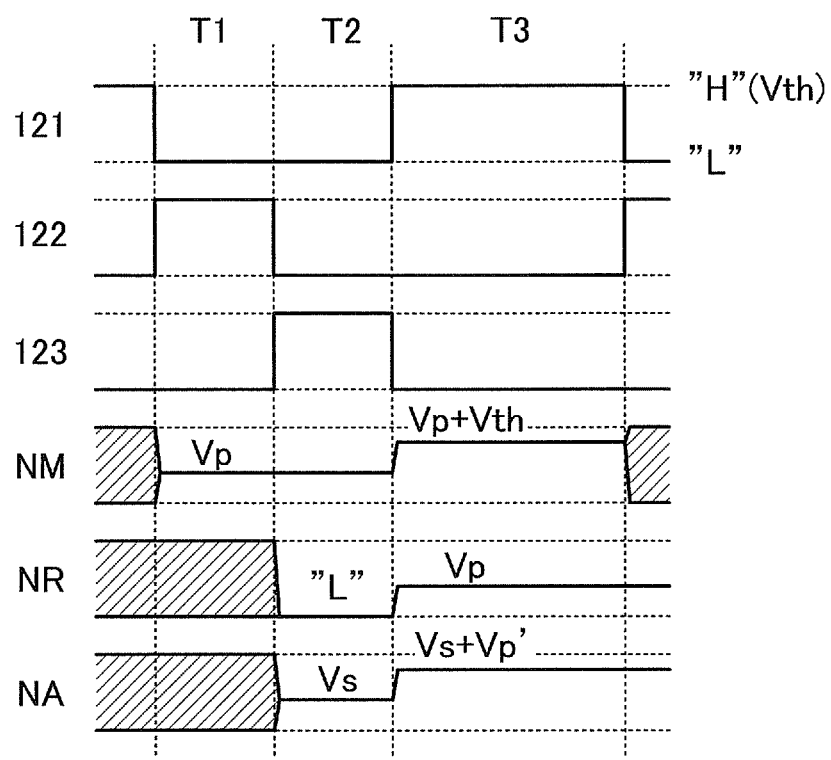
FIG. 15 A timing chart showing an operation example of a pixel.

The details of the operation of the pixel 10e are described with reference to a timing chart shown in FIG. 15. At a desired timing, a correction signal (Vp) is supplied to the wiring 124 and an image signal (Vs) is supplied to the wiring 125. In the following description, "H" represents a high potential and "L" represents a low potential.

In Period T1, the potential of the wiring 121 is set to "L", the potential of the wiring 122 is set to "H", and the potential of the wiring 123 is set to "L", so that the transistor 145 is turned on and the correction signal (Vp) is written into the node NM.

In Period T2, the potential of the wiring 121 is set to "L", the potential of the wiring 122 is set to "L", and the potential of the wiring 123 is set to "H", so that the transistor 132 is turned on and the node NR is reset to "L". In addition, the transistor 131 is turned on and the image signal (Vs) is written into the node NA.

In Period T3, the potential of the wiring 121 is set to "H", the potential of the wiring 122 is set to "L", and the potential of the wiring 123 is set to "L", so that the potential of the wiring 121 is added to the potential of the node NM owing to capacitive coupling of the capacitor 147. In that case, the potential of the wiring 121 is set to the threshold voltage (Vth) of the transistor 146, so that the potential of the node NM becomes Vp+Vth. Then, the transistor 146 is turned on, and the potential of the node NR becomes a potential that is lower than the gate potential of the transistor 146 by the threshold voltage (Vth), that is, a potential corresponding to the correction signal (Vp).

Owing to the capacitive coupling of the capacitor 133, a potential (Vp') corresponding to the capacitance ratio of the node NR to the node NA is added to the image signal (Vs). That is, the potential of the node NA becomes Vs+Vp'.

In this manner, a potential derived from a correction signal can be added to an image signal, which enables display to be corrected.

Figure 16:
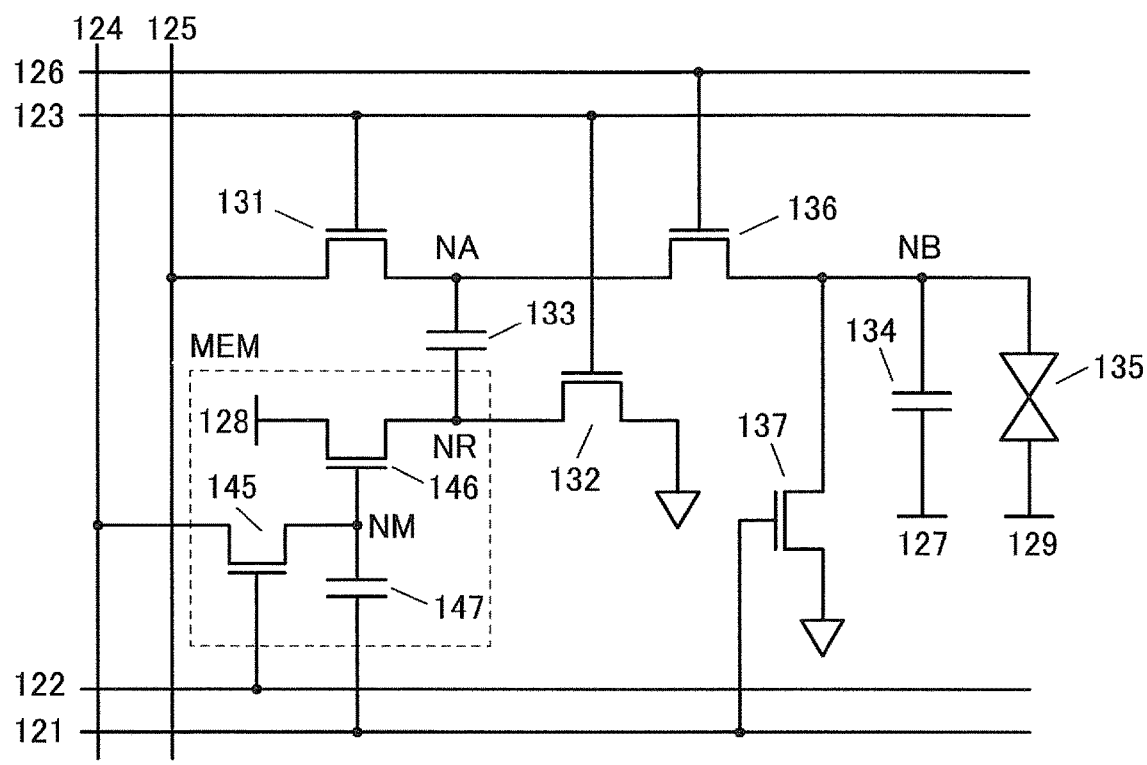
FIG. 16 A diagram illustrating an example of a pixel.

A pixel 10f illustrated in FIG. 16 has a configuration obtained by adding a transistor 136, a transistor 137, and the wiring 126 to the pixel 10e illustrated in FIG. 14.

One of a source and a drain of the transistor 136 is electrically connected to the one of the source and the drain of the transistor 131. The other of the source and the drain of the transistor 136 is electrically connected to the one electrode of the liquid crystal element 135. One of a source and a drain of the transistor 137 is electrically connected to the other of the source and the drain of the transistor 136, and the other of the source and the drain of the transistor 137 is electrically connected to a power supply line (low potential).

In the above configuration, a node at which the one of the source and the drain of the transistor 131, the one electrode of the capacitor 133, and the one of the source and the drain of the transistor 136 are connected is referred to as the node NA. A node at which the other of the source and the drain of the transistor 136, the one electrode of the capacitor 134, and the one electrode of the liquid crystal element 135 are connected is referred to as a node NB.

A gate of the transistor 136 is electrically connected to the wiring 126. A gate of the transistor 137 is electrically connected to the wiring 121. The wiring 126 can have a function of a signal line for controlling the operation of the transistor.

In the pixel 10e, the image signal is input and then the operation for adding the correction signal is performed; thus, the liquid crystal element 135 sometimes operates in a stepwise manner. Hence, the operation of the liquid crystal element 135 is recognized depending on its response characteristics, which sometimes decreases the display quality.

In the pixel 10f, the image signal is supplied to the node NA and the correction signal is added while the transistor 136 is turned off. After that, the transistor 136 is turned on, so that the corrected image signal is supplied to the node NB. Thus, the liquid crystal element 135 does not operate in a stepwise manner, inhibiting a decrease in the display quality.

Figure 17:
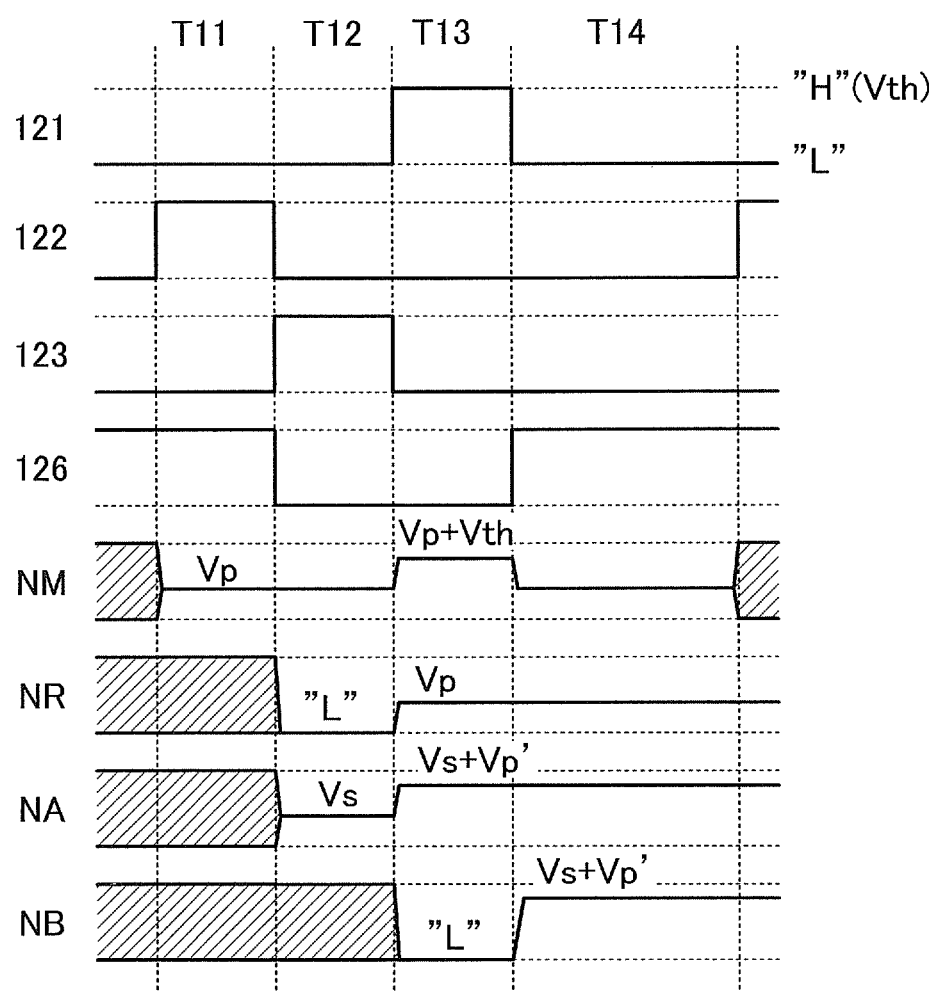
FIG. 17 A timing chart showing an operation example of a pixel.

The details of the operation of the pixel 10f are described with reference to a timing chart shown in FIG. 17. At an appropriate timing, a correction signal (Vp) is supplied to the wiring 124 and an image signal (Vs) is supplied to the wiring 125. In the following description, "H" represents a high potential and "L" represents a low potential.

In Period T11, the potential of the wiring 121 is set to "L", the potential of the wiring 122 is set to "H", and the potential of the wiring 123 is set to "L", so that the transistor 145 is turned on and the correction signal (Vp) is written into the node NM. Note that the potential of the wiring 126 remains at "H" in Period T11 continuously from the operation of the previous frame.

In Period T12, the potential of the wiring 121 is set to "L", the potential of the wiring 122 is set to "L", the potential of the wiring 123 is set to "H", and the potential of the wiring 126 is set to "L", so that the transistor 132 is turned on and the node NR is reset to "L". In addition, the transistor 131 is turned on and the image signal (Vs) is written into the node NA. Moreover, the transistor 136 is turned off, so that the potential of the node NB is continuously held and display continues.

In Period T13, the potential of the wiring 121 is set to "H", the potential of the wiring 122 is set to "L", the potential of the wiring 123 is set to "L", and the potential of the wiring 126 is set to "L", so that the potential of the wiring 121 is added to the potential of the node NM owing to capacitive coupling of the capacitor 147. In that case, the potential of the wiring 121 is set to the threshold voltage (Vth) of the transistor 146, so that the potential of the node NM becomes Vp+Vth. Then, the transistor 146 is turned on, and the potential of the node NR becomes a potential that is lower than the gate potential of the transistor 146 by the threshold voltage (Vth), that is, a potential corresponding to the correction signal (Vp).

Owing to the capacitive coupling of the capacitor 133, a potential (Vp') corresponding to the capacitance ratio of the node NR to the node NA is added to the image signal (Vs). That is, the potential of the node NA becomes Vs+Vp'. The transistor 137 is turned on, so that the potential of the node NB is reset to "L".

In Period T14, the potential of the wiring 121 is set to "L", the potential of the wiring 122 is set to "L", the potential of the wiring 123 is set to "L", and the potential of the wiring 126 is set to "H", so that the potential of the node NA is distributed to the node NB and the potential of the node NB becomes (Vs+Vp')'.

In this manner, a potential derived from a correction signal can be added to an image signal, which enables display to be corrected.

As described above, the display system of this embodiment includes a processing unit and a display unit; the processing unit can generate an image signal and a correction signal and the display unit can retain the correction signal in a memory circuit provided in a pixel. The display unit can display an image by using the correction signal and the image signal. The resolution of the image can be converted by adding the correction signal to the image signal, for example. Since the resolution of data included in the image signal generated by image processing do not need to be changed from the resolution of data input from the outside, the amount of arithmetic operation of the image processing can be reduced and power consumption can be reduced.

This embodiment can be combined with the other embodiments as appropriate. In this specification, in the case where a plurality of structure examples are shown in one embodiment, the structure examples can be combined as appropriate.

Embodiment 2

In this embodiment, a structure example of a semiconductor device, which can be used in the neural network described in Embodiment 1, will be described.

Figure 18A:
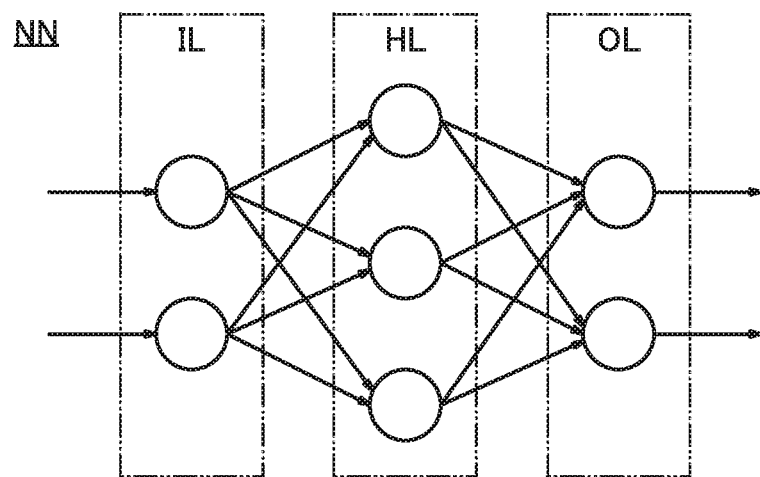
FIG. 18 Diagrams illustrating a structure example of a neural network.

As illustrated in FIG. 18(A), the neural network NN can be formed of the input layer IL, the output layer OL, and the middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 18B:
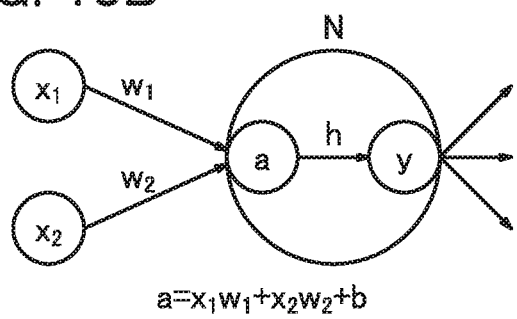

FIG. 18(B) illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that a value $a=x_1w_1+x_2w_2+b$ is obtained. Then, the value a is converted with an activation function h, and an output signal $y=h(a)$ is output from the neuron N.

As described above, the operation with the neurons includes the product-sum operation, that is, the operation that sums the products of the outputs and the weights of the neurons in the previous layer ($x_1w_1+x_2w_2$ described above). This product-sum operation may be performed using a program on software or using hardware. In the case where the product-sum operation is performed using hardware, a product-sum operation circuit can be used. Either a digital circuit or an analog circuit may be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed using a transistor including silicon (such as single crystal silicon) in a channel formation region (also referred to as a "Si transistor") or may be formed using a transistor including an oxide semiconductor, which is a kind of metal oxide, in a channel formation region (also referred to as an "OS transistor"). An OS transistor is particularly suitable for a transistor included in a memory of the product-sum operation circuit because of its extremely low off-state current. Note that the product-sum operation circuit may be formed using both a Si transistor and an OS transistor. A configuration example of a semiconductor device having a function of the product-sum operation circuit will be described below.

<Configuration Example of Semiconductor Device>

Figure 19:
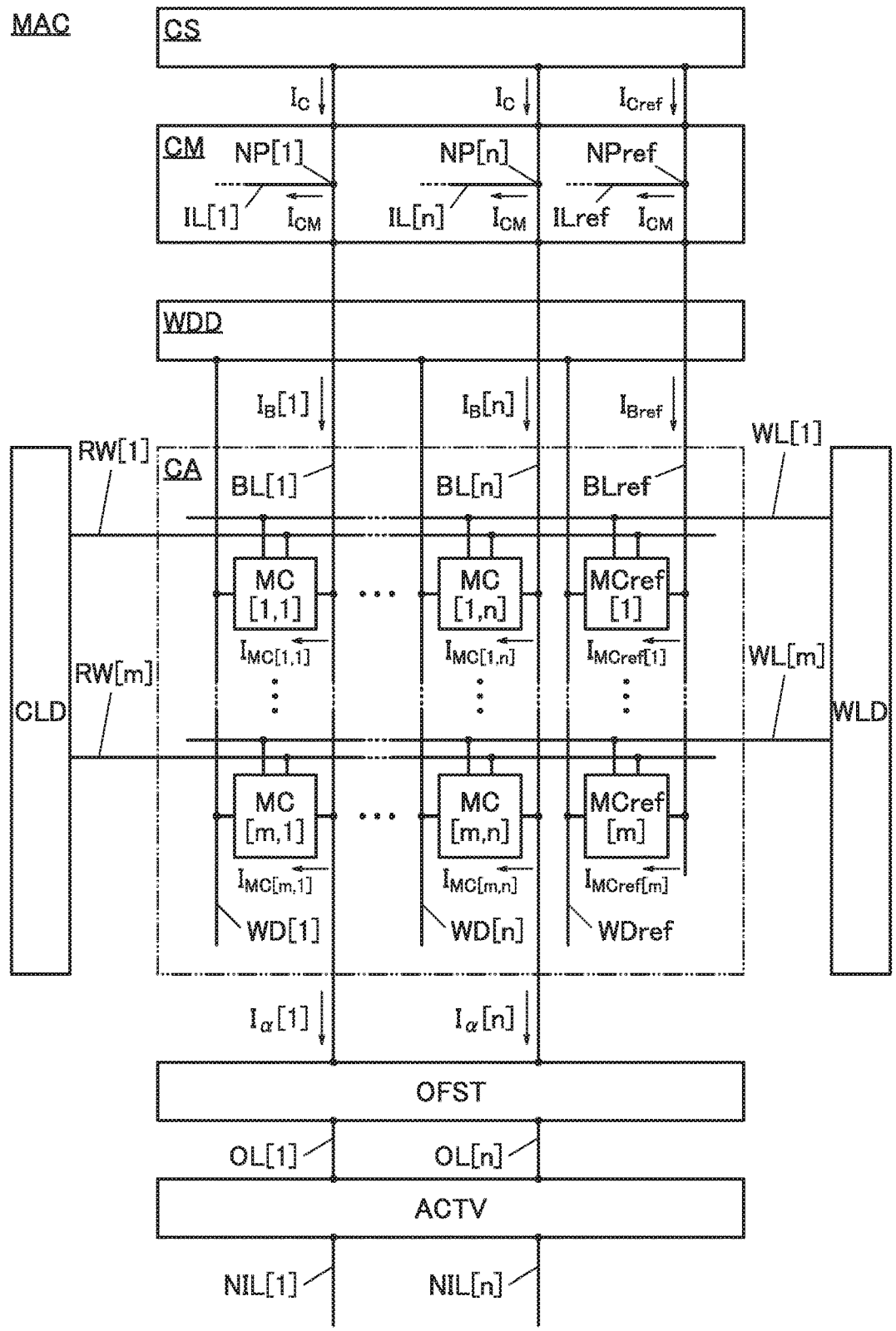
FIG. 19 A diagram illustrating a configuration example of a semiconductor device.

FIG. 19 illustrates a configuration example of a semiconductor device MAC having a function of performing an operation of a neural network. The semiconductor device MAC has a function of performing a product-sum operation of first data corresponding to the connection strength between neurons (weight) and second data corresponding to input data. Note that the first data and the second data can each be analog data or multilevel digital data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. FIG. 19 illustrates a configuration example in which the cell array CA includes the memory cells MC in m rows and n columns (MC[1, 1] to MC[m, n]) and the m memory cells MCref (MCref[1] to MCref[m]) (m and n are integers greater than or equal to 1). The memory cells MC each have a function of storing the first data. In addition, the memory cells MCref each have a function of storing reference data used for the product-sum operation. Note that the reference data can be analog data or multilevel digital data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i, j]}$, and a current flowing between the memory cell MCref[i] and the wiring BLref is denoted by $I_{MCref[i]}$.

Figure 20:
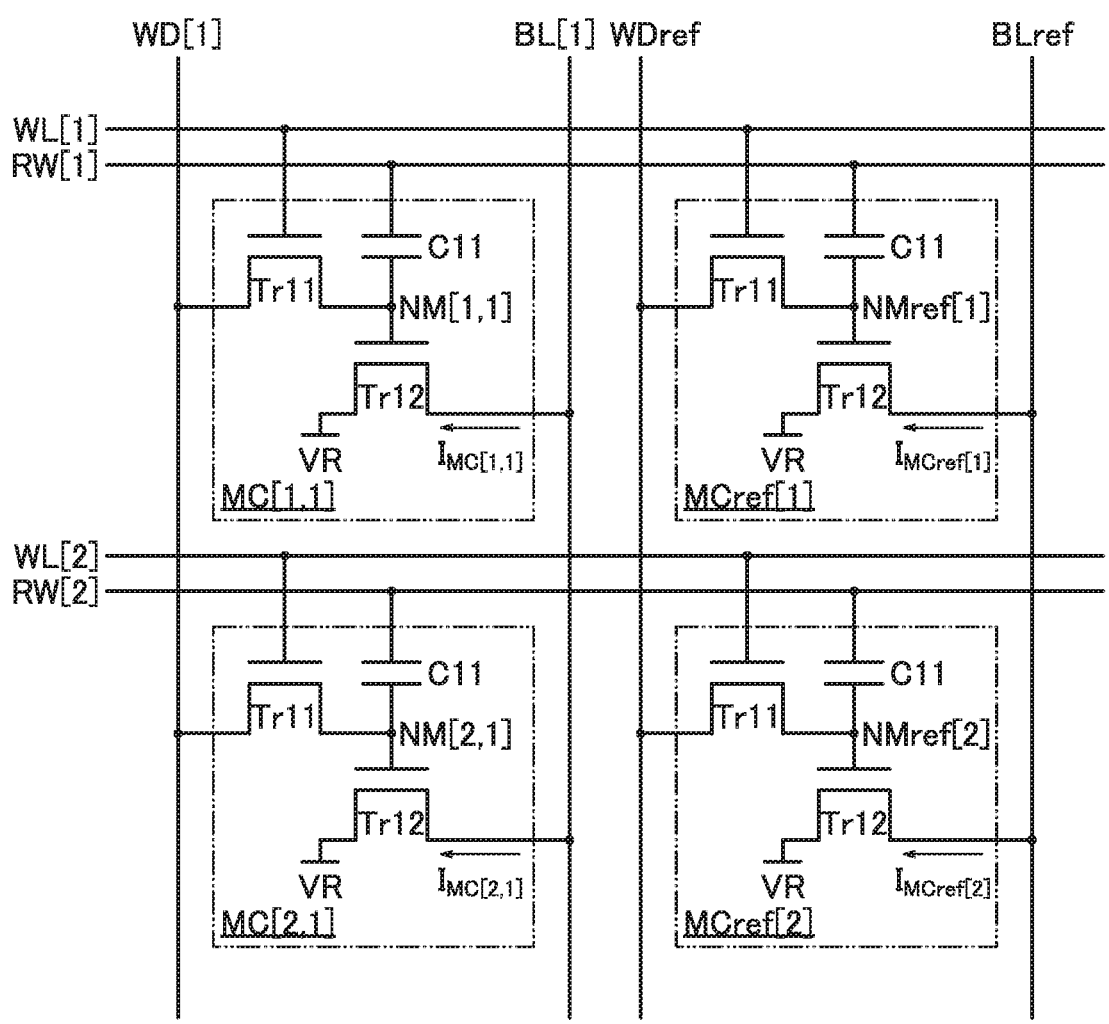
FIG. 20 A diagram illustrating a configuration example of a memory cell.

FIG. 20 illustrates a specific configuration example of the memory cells MC and the memory cells MCref. Although the memory cells MC[1, 1] and MC[2, 1] and the memory cells MCref[1] and MCref[2] are illustrated in FIG. 20 as typical examples, similar configurations can be used for other memory cells MC and memory cells MCref. The memory cells MC and the memory cells MCref each include a transistor Tr11, a transistor Tr12, and a capacitor C11. Here, the case where the transistor Tr11 and the transistor Tr12 are n-channel transistors will be described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

A node connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The node NM and the node NMref function as holding nodes of the memory cell MC and the memory cell MCref, respectively. The first data is held in the node NM and the reference data is held in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This inhibits a change in the potential of the node NM or the node NMref, so that the operation accuracy can be improved. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, portions where the wirings IL[1] to IL[n] are connected to the respective wirings BL[1] to BL[n] are referred to as nodes NP[1] to NP[n]. Furthermore, a portion where the wiring ILref is connected to the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example illustrated in FIG. 19, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data to be stored in the memory cells MC to the wirings WD[1] to WD[n]. The circuit WDD also has a function of supplying a potential corresponding to the reference data to be stored in the memory cell MCref to the wiring WDref. The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 21:
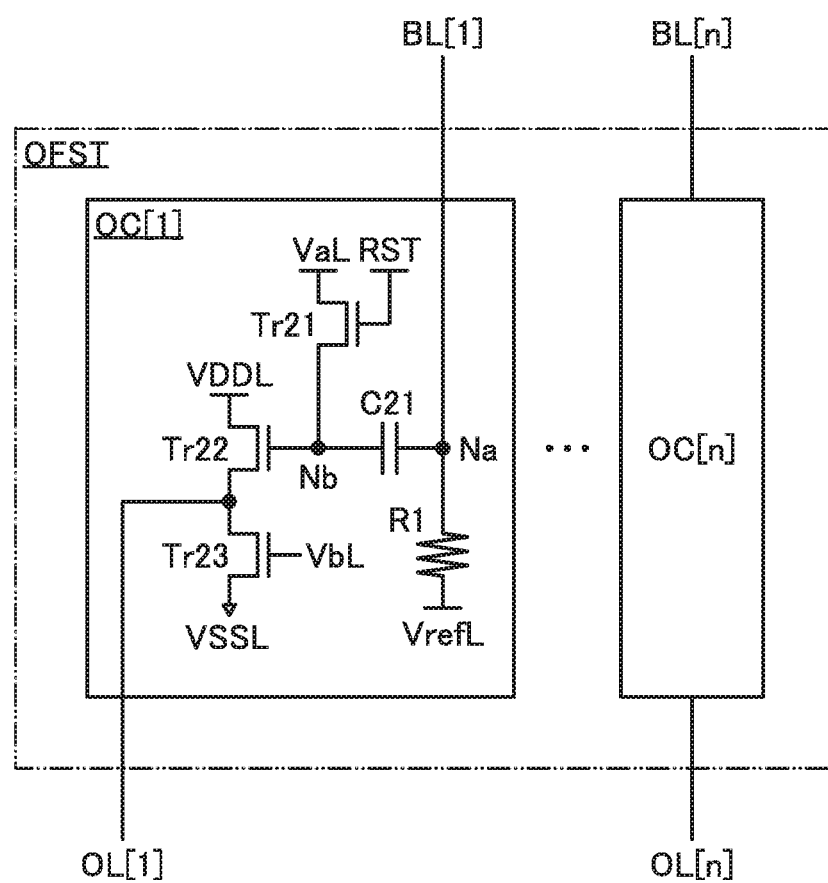
FIG. 21 A diagram illustrating a configuration example of an offset circuit.

FIG. 21 illustrates a configuration example of the offset circuit OFST. The offset circuit OFST illustrated in FIG. 21 includes circuits OC[1] to OC[n]. The circuits OC[1] to OC[n] each include a transistor Tr21, a transistor Tr22, a transistor Tr23, a capacitor C21, and a resistor R1. Connection relations of the elements are illustrated in FIG. 21. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1. At this time, the transistor Tr21 is in an on state, and thus the potential Va is supplied to the node Nb. Then, the transistor Tr21 is brought into an off state.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb changes because of capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. When the threshold voltage of the transistor Tr22 is $V_{th}$, a potential $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistance of the resistor R1, and the potential Vref. Here, since the resistance of the resistor R1 and the potential Vref are known, the amount of change in the current flowing to the wiring BL can be found from the potential $\Delta V_{Na}$.

A signal corresponding to the amount of current and/or the amount of change in the current that are/is detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with the predefined activation function. As the activation function, for example, a sigmoid function, a tanh function, a softmax function, a ReLU function, a threshold function, or the like can be used. The signal converted by the activation function circuit ACTV is output as output data to the wirings NIL[1] to NIL[n].

<Operation Example of Semiconductor Device>

The product-sum operation of the first data and the second data can be performed using the above semiconductor device MAC. An operation example of the semiconductor device MAC at the time of performing the product-sum operation is described below.

Figure 22:
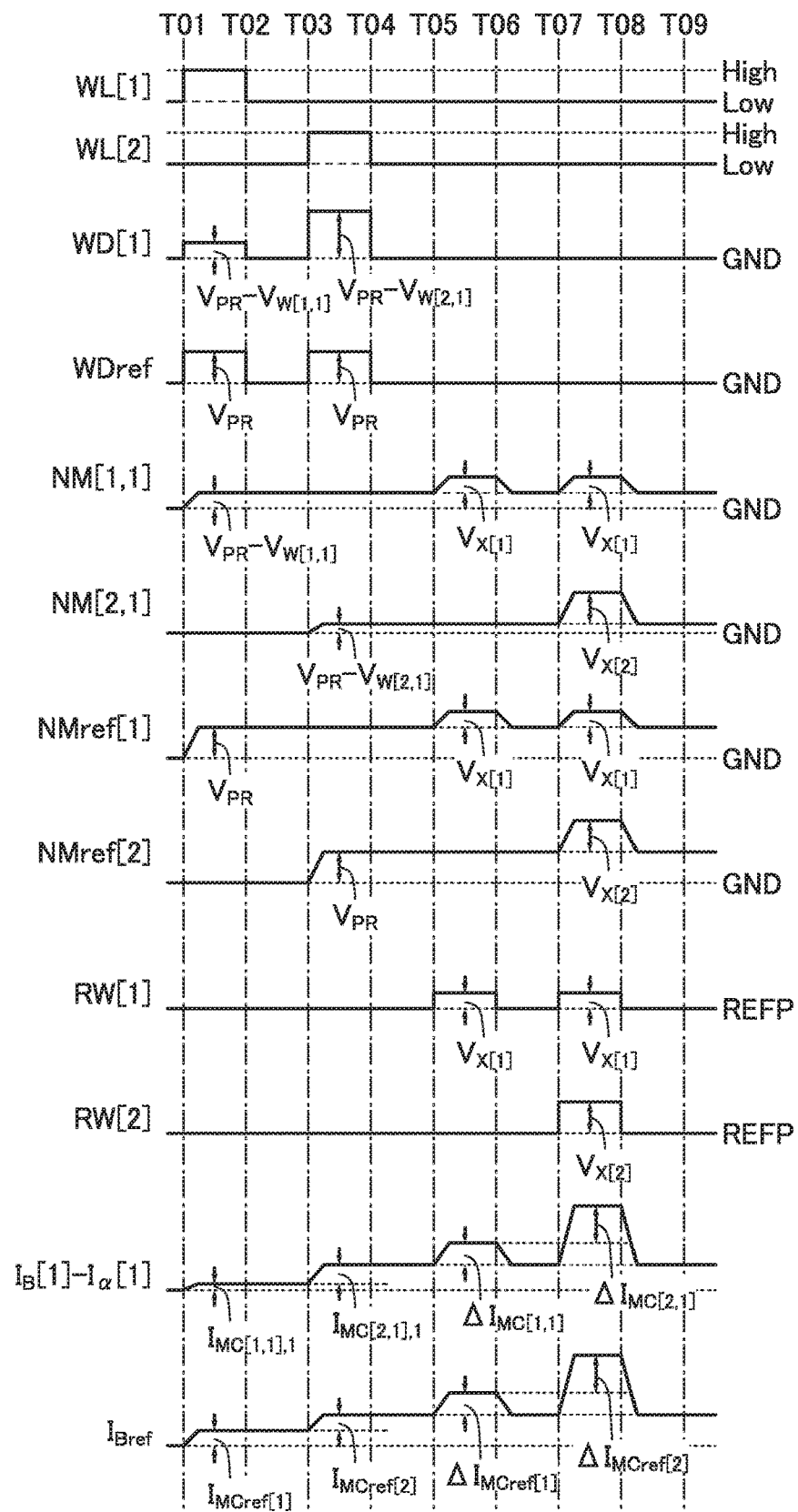
FIG. 22 A timing chart showing an operation example of a semiconductor device.

FIG. 22 illustrates a timing chart of the operation example of the semiconductor device MAC. FIG. 22 shows changes in the potentials of the wiring WL[1], the wiring WL[2], the wiring WD[1], the wiring WDref, the node NM[1, 1], the node NM[2, 1], the node NMref[1], the node NMref[2], the wiring RW[1], and the wiring RW[2] in FIG. 20 and changes in the values of a current $I_B[1]-I_\alpha[1]$ and the current $I_{Bref}$. The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 20 as a typical example, the other memory cells MC and the other memory cells MCref can be operated in a similar manner.

[Storage of First Data]

First, in a period from Time T01 to Time T02, the potential of the wiring WL[1] becomes a high level, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wiring RW[1] and the wiring RW[2] become reference potentials (REFP). Note that the potential $V_{W[1, 1]}$ is a potential corresponding to the first data stored in the memory cell MC[1, 1]. The potential $V_{PR}$ is a potential corresponding to the reference data. Thus, the transistors Tr11 included in the memory cell MC[1, 1] and the memory cell MCref[1] are brought into on states, and the potential of the node NM[1, 1] becomes $V_{PR}-V_{W[1, 1]}$ and the potential of the node NMref[1] becomes $V_{PR}$.

In this case, a current $I_{MC[1, 1], 0}$ flowing from the wiring BL[1] to the transistor Tr12 in the memory cell MC[1, 1] can be expressed by the following formula. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1,1],0}=k(V_{PR}-V_{W[1,1]}-V_{th})^2 \tag{E1}$$

Furthermore, a current $I_{MCref[1], 0}$ flowing from the wiring BLref to the transistor Tr12 in the memory cell MCref[1] can be expressed by the following formula.

$$I_{MCref[1],0}=k(V_{PR}-V_{th})^2 \tag{E2}$$

Next, in a period from Time T02 to Time T03, the potential of the wiring WL[1] becomes a low level. Consequently, the transistors Tr11 included in the memory cell MC[1, 1] and the memory cell MCref[1] are brought into off states, and the potentials of the node NM[1, 1] and the node NMref[1] are retained.

As described above, an OS transistor is preferably used as the transistor Tr11. This can suppress the leakage current of the transistor Tr11, so that the potentials of the node NM[1, 1] and the node NMref[1] can be retained accurately.

Next, in a period from Time T03 to Time T04, the potential of the wiring WL[2] becomes the high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are brought into on states, and the potential of the node NM[2, 1] becomes $V_{PR}-V_{W[2, 1]}$ and the potential of the node NMref[2] becomes $V_{PR}$.

In this case, a current $I_{MC[2, 1], 0}$ flowing from the wiring BL[1] to the transistor Tr12 in the memory cell MC[2, 1] can be expressed by the following formula.

$$I_{MC[2,1],0} = k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by the following formula.

$$I_{MCref[2],0} = k(V_{PR}-V_{th})^2 \quad (E4)$$

Next, in a period from Time T04 to Time T05, the potential of the wiring WL[2] becomes the low level. Consequently, the transistors Tr11 included in the memory cell MC[2, 1] and the memory cell MCref[2] are brought into off states, and the potentials of the node NM[2, 1] and the node NMref[2] are retained.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref in a period from Time T04 to Time T05 are considered. A current is supplied from the current source circuit CS to the wiring BLref. The current flowing through the wiring BLref is discharged to the current mirror circuit CM and the memory cells MCref[1] and MCref[2]. The following formula holds where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0} = I_{MCref[1],0}+I_{MCref[2],0} \quad (E5)$$

A current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM,0} = I_{MC[1,1],0}+I_{MC[2,1],0}+I_{\alpha,0} \quad (E6)$$

[Product-Sum Operation of First Data and Second Data]

Next, in a period from Time T05 to Time T06, the potential of the wiring RW[1] becomes a potential greater than the reference potential by $V_{X[1]}$. At this time, the potential $V_{X[1]}$ is supplied to the capacitor C11 in each of the memory cell MC[1, 1] and the memory cell MCref[1], so that the potential of the gate of the transistor Tr12 is increased because of capacitive coupling. Note that the potential $V_{X[1]}$ is a potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_X$ can be determined in consideration of the capacitive coupling coefficient.

When the potential $V_{X[1]}$ is supplied to the capacitors C11 in the memory cell MC[1, 1] and the memory cell MCref[1], the potentials of the node NM[1, 1] and the node NMref[1] each increase by $V_{X[1]}$.

Here, a current $I_{MC[1, 1], 1}$ flowing from the wiring BL[1] to the transistor Tr12 in the memory cell MC[1, 1] in a period from Time T05 to Time T06 can be expressed by the following formula.

$$I_{MC[1,1],1} = k(V_{PR}-V_{W[1,1]}+V_{X[1]}-V_{th})^2 \quad (E7)$$

That is, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1],1}-I_{MC[1, 1], 0}$.

A current $I_{MCref[1], 1}$ flowing from the wiring BLref to the transistor Tr12 in the memory cell MCref[1] in a period from Time T05 to Time T06 can be expressed by the following formula.

$$I_{MCref[1],1} = k(V_{PR}-V_{X[1]}-V_{th})^2 \quad (E8)$$

That is, when the potential $V_{X[1]}$ is supplied to the wiring RW[1], the current flowing from the wiring BLref to the transistor Tr12 in the memory cell MCref[1] increases by $\Delta I_{MCref}[1] = I_{MCref[1], 1}-I_{MCref[1], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM, 1}$ is the current discharged from the wiring BLref to the current mirror circuit CM.

$$I_{Cref}-I_{CM,1} = I_{MCref[1],1}+I_{MCref[2],0} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{\alpha, 1}$ is the current flowing from the wiring BL[1] to the offset circuit OFST.

$$I_C-I_{CM,1} = I_{MC[1,1],1}+I_{MC[2,1],1}+I_{\alpha,1} \quad (E10)$$

In addition, from the formulae (E1) to (E10), a difference between the current $I_{\alpha, 0}$ and the current $I_{\alpha, 1}$ (differential current $\Delta I_\alpha$) can be expressed by the following formula.

$$\Delta I_\alpha = I_{\alpha,1}-I_{\alpha,0} = 2kV_{W[1,1]}V_{X[1]} \quad (E11)$$

Thus, the differential current $\Delta I_\alpha$ is a value corresponding to the product of the potentials $V_{W[1,1]}$ and $V_{X[1]}$.

After that, in a period from Time T06 to Time T07, the potential of the wiring RW[1] becomes the reference potential, and the potentials of the node NM[1, 1] and the node NMref[1] become similar to those in a period from Time T04 to Time T05.

Next, in a period from Time T07 to Time T08, the potential of the wiring RW[1] becomes a potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitor C11 in each of the memory cell MC[1, 1] and the memory cell MCref[1], and the potentials of the node NM[1, 1] and the node NMref[1] each increase by $V_{X[1]}$ because of capacitive coupling. Furthermore, the potential $V_{X[2]}$ is supplied to the capacitor C11 in each of the memory cell MC[2, 1] and the memory cell MCref[2], and the potentials of the node NM[2, 1] and the node NMref[2] each increase by $V_{X[2]}$ because of capacitive coupling.

Here, a current $I_{MC[2, 1], 1}$ flowing from the wiring BL[1] to the transistor Tr12 in the memory cell MC[2, 1] in a period from Time T07 to Time T08 can be expressed by the following formula.

$$I_{MC[2,1],1} = k(V_{PR} - V_{W[2,1]} + V_{X[2]} - V_{th})^2 \quad (E12)$$

That is, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2, 1], 0}$.

A current $I_{MCref[2],1}$ flowing from the wiring BLref to the transistor Tr12 in the memory cell MCref[2] in a period from Time T07 to Time T08 can be expressed by the following formula.

$$I_{MCref[2],1} = k(V_{PR} - V_{X[2]} - V_{th})^2 \quad (E13)$$

That is, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The following formula holds where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from the formulae (E1) to (E8) and the formulae (E12) to (E15), a difference between the current $I_{\alpha, 0}$ and the current $I_{\alpha, 2}$ (differential current $\Delta I_\alpha$) can be expressed by the following formula.

$$\Delta I_\alpha = I_{\alpha,2} - I_{\alpha,0} = 2k(V_{W[1,1]}V_{X[1]} + V_{W[2,1]}V_{X[2]}) \quad (E16)$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, in a period from Time T08 to Time T09, the potentials of the wirings RW[1] and RW[2] become the reference potential, and the potentials of the nodes NM[1, 1] and NM[2, 1] and the nodes NMref[1] and NMref[2] become similar to those in a period from Time T04 to Time T05.

As represented by the formula (E11) and the formula (E16), the differential current $\Delta I_\alpha$ input to the offset circuit OFST can be calculated from the formula including a product term of the potentials $V_W$ corresponding to the first data (weight) and the potential $V_X$ corresponding to the second data (input data). In other words, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be freely set. In the case where the number m of rows of the memory cells MC and the memory cells MCref is an arbitrary number i, the differential current $\Delta I_\alpha$ can be expressed by the following formula.

$$\Delta I_\alpha = 2k \Sigma_i V_{W[i,1]} V_{X[i]} \quad (E17)$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cells MC and the memory cells MCref in FIG. 20 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 18(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation in the neural network can be performed using the semiconductor device MAC as described above. Furthermore, the memory cells MC and the memory cells MCref illustrated in FIG. 20 are used for the cell array CA, whereby an integrated circuit with improved operation accuracy, lower power consumption, or a reduced circuit scale can be provided.

This embodiment can be combined with the other embodiments as appropriate.

Embodiment 3

In this embodiment, display devices that can be used for the display system of one embodiment of the present invention will be described with reference to FIG. 23 to FIG. 25.

<Structure Example of Pixel>

Structure examples of a pixel 200 are described with reference to FIG. 23(A) to FIG. 23(E).

The pixel 200 includes a plurality of pixels 210. The plurality of pixels 210 each function as a subpixel. One pixel 200 is formed of the plurality of pixels 210 exhibiting different colors, and thus full-color display can be achieved in a display unit.

Figure 23A:
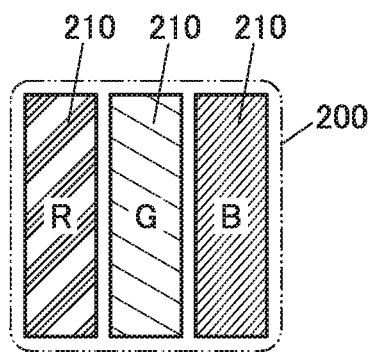
FIG. 23 Diagrams illustrating examples of a pixel.
Figure 23B:
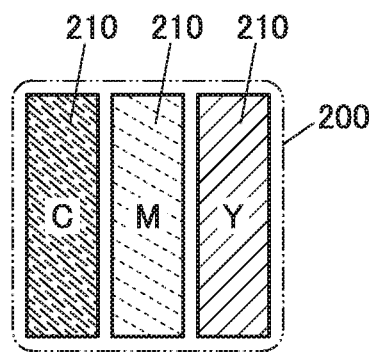

The pixels 200 illustrated in FIG. 23(A) and FIG. 23(B) each include three subpixels. The combination of colors exhibited by the pixels 210 included in the pixel 200 illustrated in FIG. 23(A) is red (R), green (G), and blue (B). The combination of colors exhibited by the pixels 210 included in the pixel 200 illustrated in FIG. 23(B) is cyan (C), magenta (M), and yellow (Y).

Figure 23C:
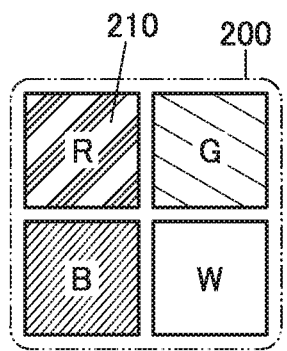
Figure 23D:
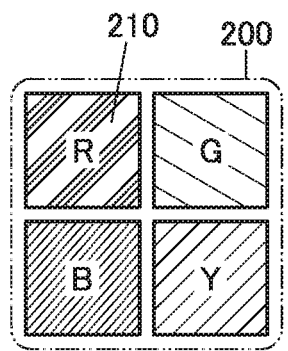
Figure 23E:
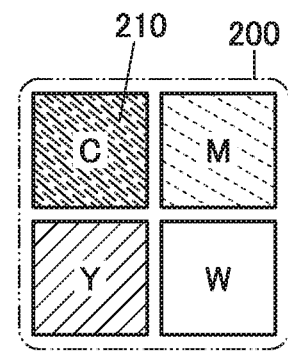

The pixels 200 illustrated in FIG. 23(C) to FIG. 23(E) each include four subpixels. The combination of colors exhibited by the pixels 210 included in the pixel 200 illustrated in FIG. 23(C) is red (R), green (G), blue (B), and white (W). The use of the subpixel that exhibits white can increase the luminance of the display unit. The combination of colors exhibited by the pixels 210 included in the pixel 200 illustrated in FIG. 23(D) is red (R), green (G), blue (B), and yellow (Y). The combination of colors exhibited by the pixels 210 included in the pixel 200 illustrated in FIG. 23(E) is cyan (C), magenta (M), yellow (Y), and white (W).

When subpixels that exhibit red, green, blue, cyan, magenta, yellow, and the like are combined as appropriate with more subpixels functioning as one pixel, the reproducibility of halftones can be increased. Thus, the display quality can be improved.

The display device of one embodiment of the present invention can reproduce the color gamut of various standards. For example, the display device of one embodiment of the present invention can reproduce the color gamut of the following standards: the PAL (Phase Alternating Line) or NTSC (National Television System Committee) standard used for TV broadcasting; the sRGB (standard RGB) or Adobe RGB standard used widely for display devices in electronic devices such as personal computers, digital cameras, and printers; the ITU-R BT.709 (International Telecommunication Union Radiocommunication Sector Broadcasting Service (Television) 709) standard used for HDTV (High Definition Televisions, also referred to as Hi-Vision); the DCI-P3 (Digital Cinema Initiatives P3) standard used for digital cinema projection; and the ITU-R BT.2020 (REC.2020 (Recommendation 2020)) standard used for UHDTV (Ultra High Definition Television, also referred to as Super Hi-Vision); and the like.

Using the pixels 200 arranged in a matrix of 1920×1080, a display device that can achieve full color display with a resolution of what is called full high definition (also referred to as "2K resolution", "2K1K", "2K", or the like) can be obtained. For example, using the pixels 200 arranged in a matrix of 3840×2160, a display device that can achieve full color display with a resolution of what is called ultra high definition (also referred to as "4K resolution", "4K2K", "4K", or the like) can be obtained. For example, using the pixels 200 arranged in a matrix of 7680×4320, a display device that can achieve full color display with a resolution of what is called super high definition (also referred to as "8K resolution", "8K4K", "8K", or the like) can be obtained. By increasing the number of pixels 200, a display device that can achieve full color display with 16K or 32K resolution can be obtained.

Examples of a display element included in the display device of one embodiment of the present invention include a light-emitting element such as an inorganic EL element, an organic EL element, or an LED, a liquid crystal element, an electrophoretic element, and a display element using micro electro mechanical systems (MEMS).

<Structure Example of Display Device>

Next, structure examples of the display device are described with reference to FIG. 24 and FIG. 25.

Figure 24:
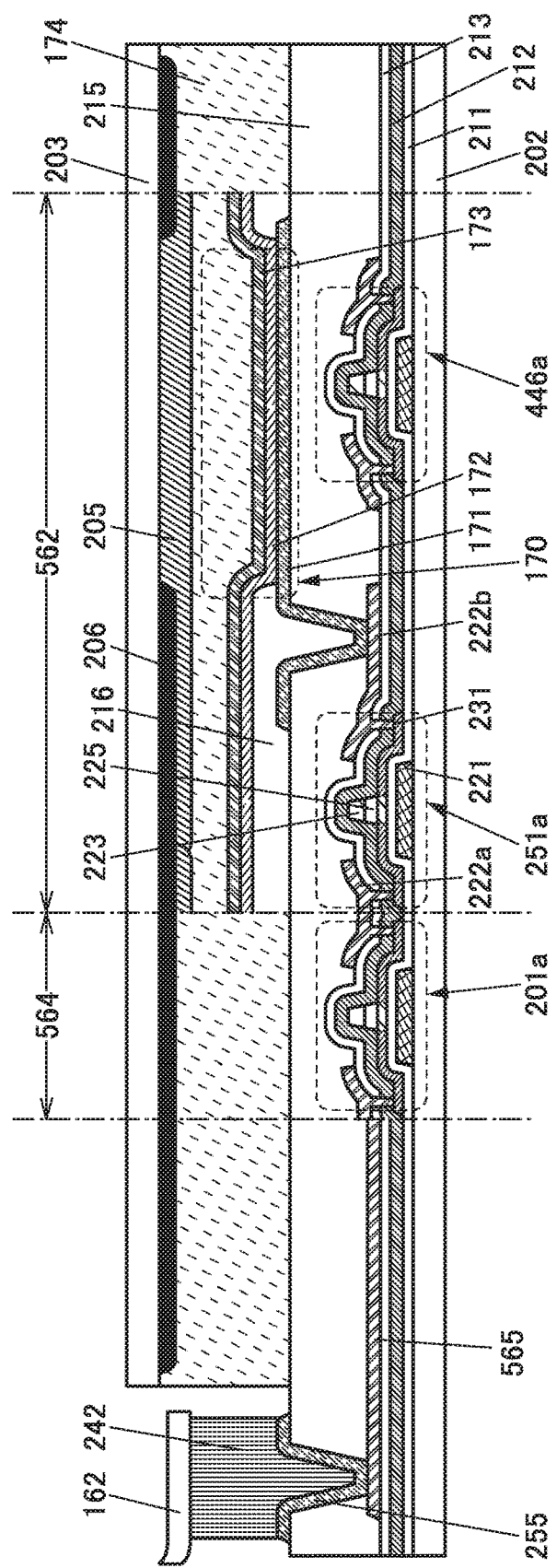
FIG. 24 A diagram illustrating an example of a display device.

FIG. 24 illustrates a cross-sectional view of a light-emitting display device employing a color filter method and having a top-emission structure.

The display device illustrated in FIG. 24 includes a pixel portion 562 and a scan line driver circuit 564.

A transistor 251a, a transistor 446a, a light-emitting element 170, and the like are provided over a substrate 202 in the pixel portion 562. A transistor 201a and the like are provided over the substrate 202 in the scan line driver circuit 564.

The transistor 251a includes a conductive layer 221 functioning as a first gate electrode, an insulating layer 211 functioning as a first gate insulating layer, a semiconductor layer 231, a conductive layer 222a and a conductive layer 222b functioning as a source electrode and a drain electrode, a conductive layer 223 functioning as a second gate electrode, and an insulating layer 225 functioning as a second gate insulating layer. The semiconductor layer 231 includes a channel formation region and a low-resistance region. The channel formation region overlaps with the conductive layer 223 with the insulating layer 225 positioned therebetween. The low-resistance region includes a region connected to the conductive layer 222a and a region connected to the conductive layer 222b.

The transistor 251a includes the gate electrodes above and below the channel. It is preferable that the two gate electrodes be electrically connected to each other. A transistor with two gate electrodes that are electrically connected to each other can have a higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display device in which the number of wirings is increased because of an increase in size or resolution. In addition, the area occupied by a circuit portion can be reduced, whereby the bezel of the display device can be narrowed. Moreover, with such a structure, a highly reliable transistor can be formed.

An insulating layer 212 and an insulating layer 213 are provided over the conductive layer 223, and the conductive layer 222a and the conductive layer 222b are provided thereover. In the structure of the transistor 251a, the conductive layer 221 can be physically distanced from the conductive layer 222a or the conductive layer 222b easily; thus, the parasitic capacitance therebetween can be reduced.

There is no particular limitation on the structure of the transistor in the display device. For example, a planar transistor, a staggered transistor, or an inverted staggered transistor may be used. The transistor structure may be a top-gate structure or a bottom-gate structure. Gate electrodes may be provided above and below a channel.

The transistor 251a includes a metal oxide in the semiconductor layer 231. The metal oxide can serve as an oxide semiconductor.

The transistor 446a and the transistor 201a have a structure similar to that of the transistor 251a. Structures of these transistors may be different in one embodiment of the present invention. A transistor included in a driver circuit portion and a transistor included in the pixel portion 562 may have the same structure or different structures. The transistors included in the driver circuit portion may have the same structure or the combination of two or more kinds of structures. Similarly, the transistors included in the pixel portion 562 may have the same structure or the combination of two or more kinds of structures.

The transistor 446a and the light-emitting element 170 overlap with each other with an insulating layer 215 positioned therebetween. A transistor, a capacitor, a wiring, and the like are provided to overlap with a light-emitting region of the light-emitting element 170, whereby an aperture ratio of the pixel portion 562 can be increased.

The light-emitting element 170 includes a pixel electrode 171, an EL layer 172, and a common electrode 173. The light-emitting element 170 emits light to a coloring layer 205 side.

One of the pixel electrode 171 and the common electrode 173 functions as an anode and the other functions as a cathode. When a voltage higher than the threshold voltage of the light-emitting element 170 is applied between the pixel electrode 171 and the common electrode 173, holes are injected to the EL layer 172 from the anode side and electrons are injected to the EL layer 172 from the cathode side. The injected electrons and holes are recombined in the EL layer 172 and a light-emitting substance contained in the EL layer 172 emits light.

The pixel electrode 171 is electrically connected to the conductive layer 222b of the transistor 251a. They may be directly connected to each other or may be connected via another conductive layer. The pixel electrode 171 functions as a pixel electrode and is provided for each light-emitting element 170. Two adjacent pixel electrodes 171 are electrically insulated from each other by an insulating layer 216.

The EL layer 172 is a layer containing a light-emitting substance.

The common electrode 173 functions as a common electrode and is shared by the plurality of light-emitting elements 170. A fixed potential is supplied to the common electrode 173.

The light-emitting element 170 and the coloring layer 205 overlap with each other with an adhesive layer 174 positioned therebetween. The insulating layer 216 and a light-blocking layer 206 overlap with each other with the adhesive layer 174 positioned therebetween.

The light-emitting element 170 may have a microcavity structure. Owing to the combination of a color filter (the coloring layer 205) and the microcavity structure, light with high color purity can be extracted from the display device.

The coloring layer 205 is a colored layer that transmits light in a specific wavelength range. For example, a color filter for transmitting light in a red, green, blue, or yellow wavelength range can be used. Examples of a material that can be used for the coloring layer 205 include a metal material, a resin material, and a resin material containing pigment or dye.

Note that without being limited to a color filter method, a separate coloring method, a color conversion method, a quantum dot method, or the like may be employed in the display device of one embodiment of the present invention. Furthermore, without being limited to a top-emission structure, a bottom-emission structure or the like may be used for the display device of one embodiment of the present invention.

The light-blocking layer 206 is provided between adjacent coloring layers 205. The light-blocking layer 206 blocks light emitted from an adjacent light-emitting element 170 to prevent color mixture between adjacent light-emitting elements 170. Here, the coloring layer 205 is provided such that its end portion overlaps with the light-blocking layer 206, whereby light leakage can be suppressed. For the light-blocking layer 206, a material that blocks light from the light-emitting element 170 can be used; for example, a black matrix can be formed using a metal material or a resin material containing pigment or dye. Note that it is preferable to provide the light-blocking layer 206 in a region other than the pixel portion 562, such as the scan line driver circuit 564, in which case undesired leakage of guided light or the like can be inhibited.

The substrate 202 and a substrate 203 are attached to each other with the adhesive layer 174.

A conductive layer 565 is electrically connected to an FPC 162 through a conductive layer 255 and a connector 242. The conductive layer 565 is preferably formed using the same material and the same fabrication step as the conductive layers included in the transistor. In an example described in this embodiment, the conductive layer 565 is formed using the same material and the same fabrication step as the conductive layers functioning as a source electrode and a drain electrode.

As the connector 242, any of various anisotropic conductive films (ACF), anisotropic conductive pastes (ACP), and the like can be used.

Figure 25:
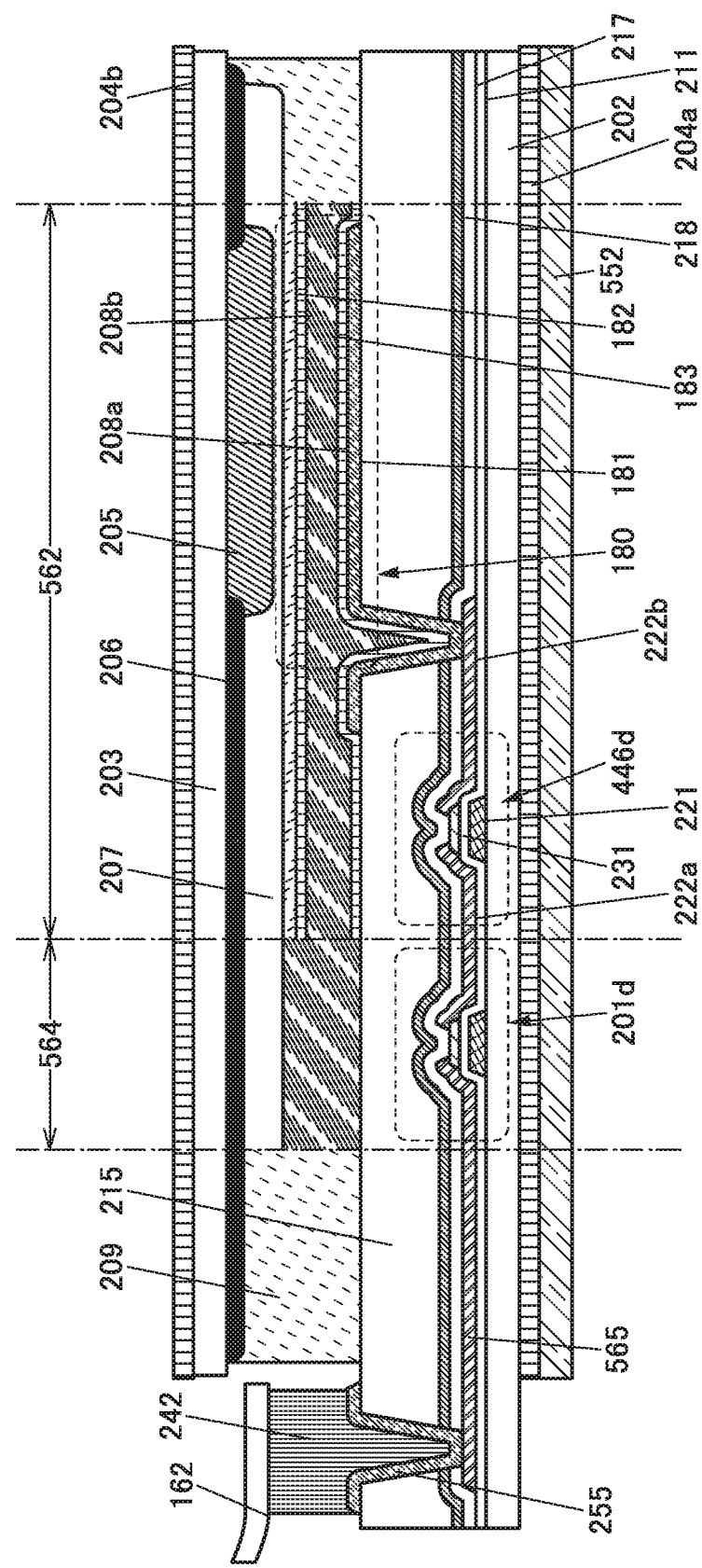
FIG. 25 A diagram illustrating an example of a display device.

FIG. 25 illustrates a cross-sectional view of a transmissive liquid crystal display device having a vertical electric field mode.

The display device illustrated in FIG. 25 includes the pixel portion 562 and the scan line driver circuit 564.

In the pixel portion 562, a transistor 446d, a liquid crystal element 180, and the like are provided over the substrate 202. In the scan line driver circuit 564, a transistor 201d and the like are provided over the substrate 202. The coloring layer 205 is provided on the substrate 203 side in the display device illustrated in FIG. 25. Note that the coloring layer 205 may be provided on the substrate 202 side. In the case where the coloring layer 205 is provided on the substrate 202 side, the structure on the substrate 203 side can be simplified.

The transistor 446d includes the conductive layer 221 functioning as a gate electrode, the insulating layer 211 functioning as a gate insulating layer, the semiconductor layer 231, and the conductive layer 222a and the conductive layer 222b functioning as a source electrode and a drain electrode. The transistor 446d is covered with an insulating layer 217 and an insulating layer 218.

The transistor 446d includes a metal oxide in the semiconductor layer 231.

The liquid crystal element 180 includes a pixel electrode 181, a common electrode 182, and a liquid crystal layer 183. The liquid crystal layer 183 is positioned between the pixel electrode 181 and the common electrode 182. An alignment film 208a is provided in contact with the pixel electrode 181. An alignment film 208b is provided in contact with the common electrode 182. The pixel electrode 181 is electrically connected to the conductive layer 222b of the transistor 446d through an opening formed in the insulating layer 215, the insulating layer 218, and the insulating layer 217.

An alignment film is preferably provided in contact with the liquid crystal layer 183. The alignment film can control the alignment of the liquid crystal layer 183.

Light from a backlight unit 552 is emitted to the outside of the display device through the substrate 202, the pixel electrode 181, the liquid crystal layer 183, the common electrode 182, the coloring layer 205, and the substrate 203.

As materials of these layers that transmit the light from the backlight unit 552, visible-light-transmitting materials are used.

An overcoat 207 is provided between the light-blocking layer 206 and the common electrode 182 and between the coloring layer 205 and the common electrode 182. The overcoat 207 can inhibit the diffusion of impurities contained in the coloring layer 205, the light-blocking layer 206, and the like to the liquid crystal layer 183.

The substrate 202 and the substrate 203 are attached to each other with an adhesive layer 209. The liquid crystal layer 183 is encapsulated in a region that is surrounded by the substrate 202, the substrate 203, and the adhesive layer 209.

A polarizing plate 204*a* and a polarizing plate 204*b* are provided with the pixel portion 562 of the display device positioned therebetween. Light from the backlight unit 552 provided outside the polarizing plate 204*a* enters the display device through the polarizing plate 204*a*. In this case, the optical modulation of the light can be controlled by controlling the alignment of the liquid crystal layer 183 with a voltage supplied between the pixel electrode 181 and the common electrode 182. In other words, the intensity of light emitted through the polarizing plate 204*b* can be controlled. Furthermore, the coloring layer 205 absorbs light of wavelengths other than a specific wavelength range from the incident light. As a result, the ejected light is light that exhibits red, blue, or green colors, for example.

The conductive layer 565 is electrically connected to the FPC 162 through the conductive layer 255 and the connector 242.

Without being limited to a vertical-electric-field mode, a lateral-electric-field mode may be used for the liquid crystal display device of one embodiment of the present invention. For a liquid crystal display device with a lateral-electric-field mode, a liquid crystal element employing an FFS (Fringe Field Switching) mode may be used, for example.

<Semiconductor Layer>

There is no particular limitation on the crystallinity of a semiconductor material used for the transistors disclosed in one embodiment of the present invention, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

Embodiment 5 can be referred to for the details of the metal oxide favorably used for a semiconductor layer.

As a semiconductor material used for the transistor, for example, silicon can be used. In particular, amorphous silicon is preferably used as the silicon. By using amorphous silicon, transistors can be formed over a large-area substrate with high yield, so that mass productivity can be improved.

Alternatively, silicon having crystallinity, such as microcrystalline silicon, polycrystalline silicon, or single crystal silicon, can be used. In particular, polycrystalline silicon can be formed at a temperature lower than that for single crystal silicon and has higher field-effect mobility and higher reliability than amorphous silicon.

One display device may include two or more kinds of transistors whose semiconductor layers have different materials.

This embodiment can be combined with the other embodiments as appropriate.

Embodiment 4

A semiconductor device that can be used for the display system described as an example in the above embodiment will be described in this embodiment. The semiconductor device described below as an example can function as a memory device. The semiconductor device can be used for the storage unit included in the display system, for example.

In this embodiment, a DOSRAM (registered trademark) will be described as an example of a memory device using an oxide semiconductor. The name "DOSRAM" stands for a Dynamic Oxide Semiconductor Random Access Memory. A DOSRAM refers to a memory device in which a memory cell is a 1T1C (one transistor and one capacitor) cell where a writing transistor is a transistor formed using an oxide semiconductor.

A layered structure example of a DOSRAM 1000 will be described with reference to FIG. 26. In the DOSRAM 1000, a sense amplifier portion 1002 that performs data reading and a cell array portion 1003 that stores data are stacked.

Figure 26:
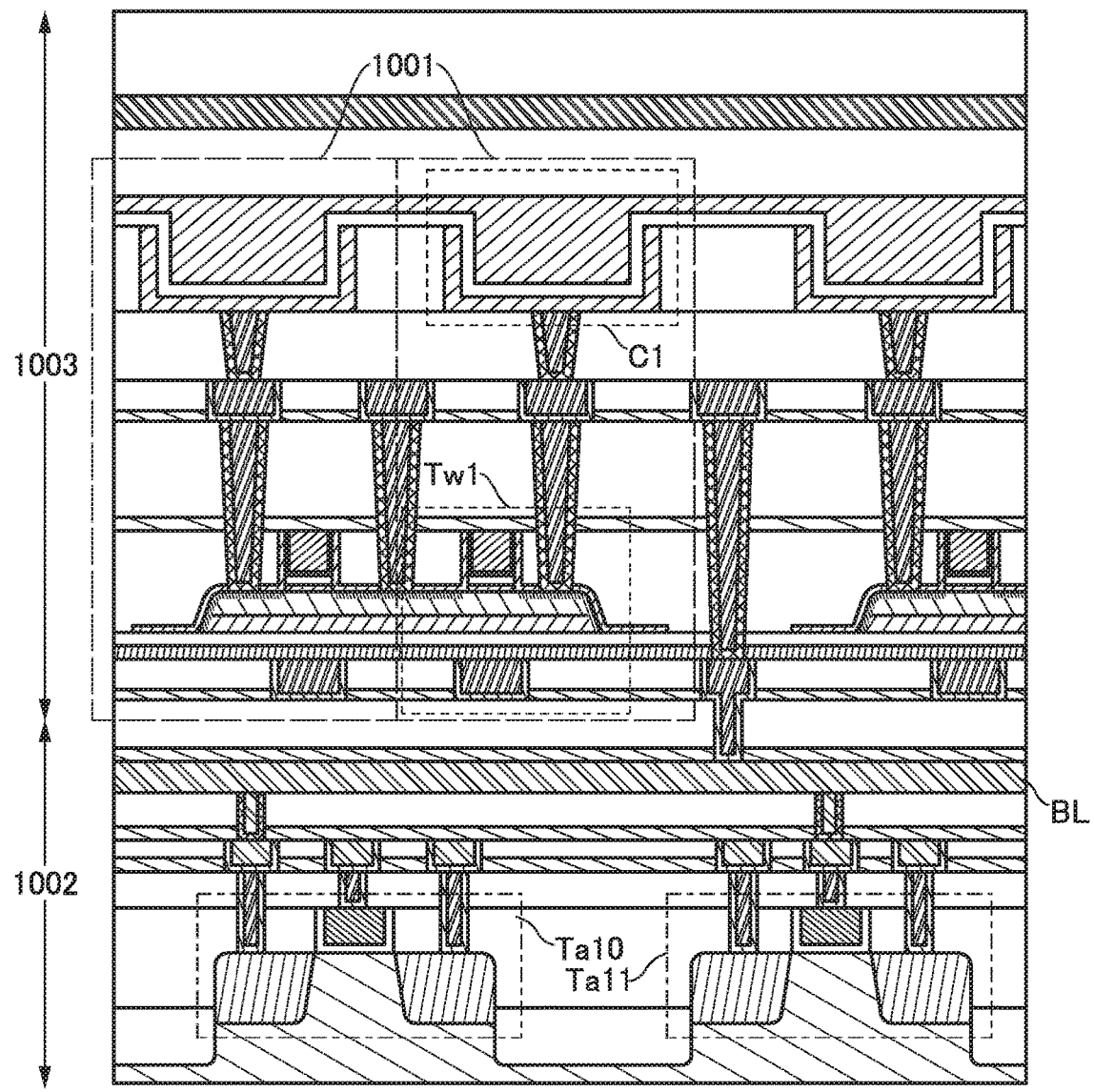
FIG. 26 A diagram illustrating an example of a DOSRAM.

As illustrated in FIG. 26, a bit line BL and Si transistors Ta10 and Ta11 are provided in the sense amplifier portion 1002. The Si transistors Ta10 and Ta11 have a semiconductor layer in a single crystal silicon wafer. The Si transistors Ta10 and Ta11 constitute the sense amplifier and are electrically connected to the bit line BL.

The cell array portion 1003 includes a plurality of memory cells 1001. The memory cell 1001 includes a transistor Tw1 and a capacitor C1. In the cell array portion 1003, two transistors Tw1 share a semiconductor layer. The semiconductor layer and the bit line BL are electrically connected to each other through a conductor that is not illustrated.

The layered structure illustrated in FIG. 26 can be used for a variety of semiconductor devices formed by stacking a plurality of circuits each including a transistor group.

Metal oxides, insulators, conductors, and the like in FIG. 26 may each be a single layer or a stack of layers. They can be formed by a variety of deposition methods such as a sputtering method, a molecular beam epitaxy method (MBE method), a pulsed laser ablation method (PLA method), a chemical vapor deposition (CVD) method, and an atomic layer deposition method (ALD method). Examples of the CVD method include a plasma CVD method, a thermal CVD method, and a metal organic CVD method.

Here, the semiconductor layer of the transistor Tw1 is formed using a metal oxide (oxide semiconductor). An example is illustrated in which the semiconductor layer is formed of three metal oxide layers. The semiconductor layer is preferably formed using a metal oxide containing In, Ga, and Zn.

Here, when an element that can form an oxygen vacancy or an element that can be bonded to an oxygen vacancy is added to a metal oxide, the carrier density is increased and the resistance is reduced in some cases. For example, when a semiconductor layer with a metal oxide is selectively reduced in resistance, a source region or a drain region can be provided in the semiconductor layer.

Typical examples of an element that reduces the resistance of a metal oxide include boron and phosphorus. Moreover, hydrogen, carbon, nitrogen, fluorine, sulfur, chlorine, titanium, a rare gas, or the like may be used. Typical examples of the rare gas element include helium, neon, argon, krypton, xenon, and the like. The concentration of the element can be measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

The transistor including the semiconductor layer having selectively reduced resistance can be formed using a dummy gate, for example. Specifically, the dummy gate is provided over the semiconductor layer, and an element that reduces the resistance of the semiconductor layer is added to the semiconductor layer using the dummy gate as a mask. That is, the element is added to a region of the semiconductor layer that does not overlap with the dummy gate, so that a low-resistance region is formed. As a method for adding the element, an ion implantation method by which an ionized source gas is subjected to mass separation and then added, an ion doping method by which an ionized source gas is added without mass separation, a plasma immersion ion implantation method, or the like can be used.

Examples of a conductive material used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; a metal nitride containing the above metal as its component (tantalum nitride, titanium nitride, molybdenum nitride, or tungsten nitride); and the like. A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

Examples of an insulating material used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound whose oxygen content is higher than nitrogen content, and a nitride oxide refers to a compound whose nitrogen content is higher than oxygen content.

This embodiment can be combined with the other embodiments as appropriate.

Embodiment 5

Described in this embodiment is a metal oxide that can be used for a semiconductor layer of a transistor disclosed in one embodiment of the present invention. Note that in the case where a metal oxide is used for a semiconductor layer of a transistor, the metal oxide may be rephrased as an oxide semiconductor.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used for a semiconductor layer of a transistor. The use of the CAC-OS allows the transistor to have high electrical characteristics or high reliability.

The CAC-OS will be described in detail below.

A CAC-OS or a CAC-metal oxide has a conducting function in a part of the material and has an insulating function in a part of the material and has a function of a semiconductor as a whole. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. It is particularly preferable that the metal oxide contain indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a c-axis aligned crystal (CAAC) structure. Note that the CAAC structure is a crystal structure in which a plurality of IGZO nanocrystals have c-axis alignment and are connected on the a-b plane without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. Furthermore, the ratio of the flow rate of an oxygen gas to the total flow rate of the film formation gas at the time of film formation is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices.

This embodiment can be combined with the other embodiments as appropriate.

Embodiment 6

In this embodiment, electronic devices of one embodiment of the present invention are described with reference to FIG. 27.

The electronic devices of this embodiment each include the display system of one embodiment of the present invention. Therefore, a display unit of each of the electronic devices can display a high-quality image. Specifically, a large-sized display device or a high-resolution display device can achieve favorable display quality.

The display unit of the electronic device of this embodiment can display an image with a resolution of, for example, full high definition, 2K, 4K, 8K, 16K, or more. In addition, the screen size of the display unit can be 20 inches diagonal or more, 30 inches diagonal or more, 50 inches diagonal or more, 60 inches diagonal or more, or 70 inches diagonal or more.

Examples of the electronic devices in which the display system of one embodiment of the present invention can be used include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor for a computer or the like, digital signage, and a large game machine such as a pachinko machine. Furthermore, the display system of one embodiment of the present invention can be suitably used in portable electronic devices, wearable electronic devices (wearable devices), VR (Virtual Reality) devices, AR (Augmented Reality) devices, and the like.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display unit. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of one embodiment of the present invention can have a variety of functions. For example, the electronic device can have a function of displaying a variety of data (e.g., a still image, a moving image, and a text image) on a display unit; a touch panel function; a function of displaying a calendar, date, time, or the like; a function of executing a variety of software (programs); a wireless communication function; a function of reading out a program or data stored in a recording medium; and the like.

Furthermore, an electronic device including a plurality of display units can have a function of displaying image data mainly on one display unit while displaying text data mainly on another display unit, a function of displaying a three-dimensional image by displaying images on a plurality of display units with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display unit, or the like. Note that functions of the electronic device of one embodiment of the present invention are not limited thereto, and the electronic devices can have a variety of functions.

Figure 27A:
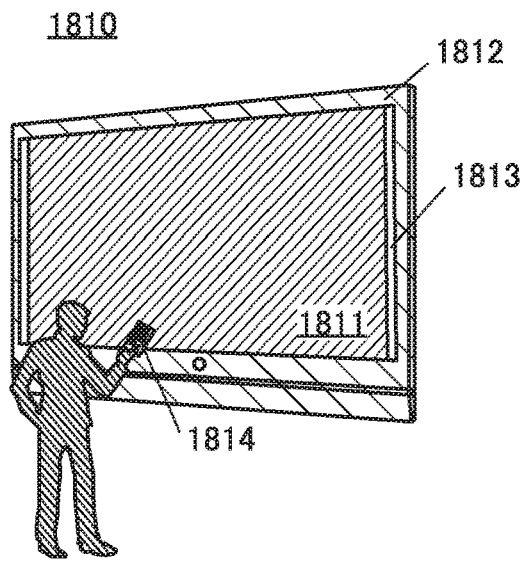
FIG. 27 Diagrams illustrating examples of electronic devices.

FIG. 27(A) illustrates a television device 1810. The television device 1810 includes a display unit 1811, a housing 1812, a speaker 1813, and the like. An LED lamp, operation keys (including a power switch or an operation switch), a connection terminal, a variety of sensors, a microphone, and the like can be also included.

The television device 1810 can be controlled with a remote controller 1814.

As airwaves the television device 1810 can receive, ground waves, waves transmitted from a satellite, and the like can be given. Furthermore, as the airwaves, airwaves for analog broadcasting, digital broadcasting, image-and-sound broadcasting, audio-only broadcasting, and the like can be given. For example, airwaves transmitted in a certain frequency band in a UHF band (approximately 300 MHz to 3 GHz) or a VHF band (30 MHz to 300 MHz) can be received. With the use of a plurality of pieces of data received in a plurality of frequency bands, for example, the transfer rate can be increased and more information can thus be obtained. Accordingly, the display unit 1811 can display an image with a resolution higher than the full high definition. For example, an image with a resolution of 4K, 8K, 16K, or higher can be displayed.

A structure may be employed in which an image to be displayed on the display unit 1811 is generated using broadcasting data transmitted with a technology for transmitting data via a computer network such as the Internet, a LAN (Local Area Network), or Wi-Fi (registered trademark). In that case, the television device 1810 does not necessarily include a tuner.

Figure 27B:
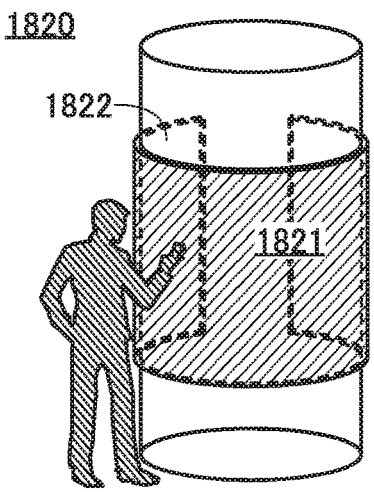

FIG. 27(B) illustrates a digital signage 1820 mounted on a cylindrical pillar 1822. The digital signage 1820 includes a display unit 1821.

The larger the display unit 1821, the more amount of information that can be provided at a time. In addition, the larger the display unit 1821 is, the more it attracts attention, so that the effectiveness of the advertisement can be increased, for example.

It is preferable to use a touch panel in the display unit 1821 because not only a still image or a moving image is displayed on the display unit 1821 but also users can operate intuitively. For an application for providing information such as route information or traffic information, usability can be enhanced by intuitive operation.

Figure 27C:
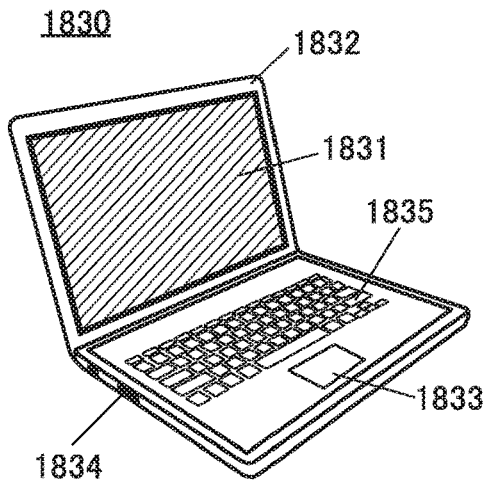

FIG. 27(C) illustrates a notebook personal computer 1830. The personal computer 1830 includes a display unit 1831, a housing 1832, a touch pad 1833, a connection port 1834, and the like.

The touch pad 1833 functions as an input means such as a pointing device or a pen tablet and can be controlled with a finger, a stylus, or the like.

Furthermore, a display element is incorporated in the touch pad 1833. As illustrated in FIG. 27(C), when input keys 1835 are displayed on a surface of the touch pad 1833, the touch pad 1833 can be used as a keyboard. In that case, a vibration module may be incorporated in the touch pad 1833 so that sense of touch is achieved by vibration when the input keys 1835 are touched.

Figure 27D:
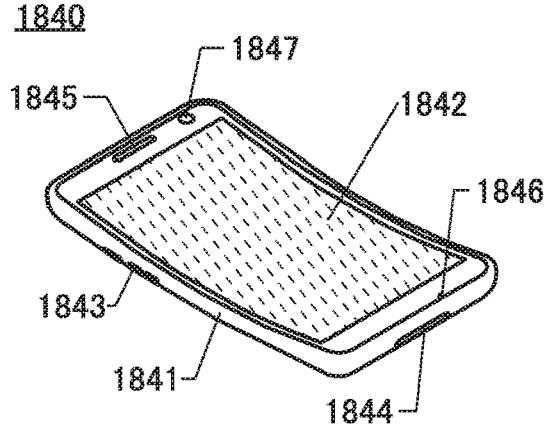

FIG. 27(D) illustrates an example of a portable information terminal. A portable information terminal 1840 illustrated in FIG. 27(D) includes a housing 1841, a display unit 1842, an operation button 1843, an external connection port 1844, a speaker 1845, a microphone 1846, a camera 1847, and the like.

The portable information terminal 1840 includes a touch sensor in the display unit 1842. All operations such as making a call and inputting a letter can be performed by a touch on the display unit 1842 with a finger, a stylus, or the like.

By an operation with the operation button 1843, power on/off operations or switching of types of images displayed on the display unit 1842 can be performed. For example, switching from a mail creation screen to a main menu screen can be performed.

When a sensing device such as a gyroscope sensor or an acceleration sensor is provided inside the portable information terminal 1840, the orientation (horizontal or vertical) of the portable information terminal 1840 can be determined and the orientation of display on the screen of the display unit 1842 can be automatically changed. The orientation of display on the screen can also be changed by a touch on the display unit 1842, an operation with the operation button 1843, sound input using the microphone 1846, or the like.

The portable information terminal 1840 has a function of, for example, one or more selected from a telephone set, a notebook, an information browsing system, and the like. Specifically, the portable information terminal can be used as a smartphone. The portable information terminal 1840 is capable of executing a variety of applications such as mobile phone calls, e-mailing, viewing and editing texts, music reproduction, video replay, Internet communication, and games.

Figure 27E:
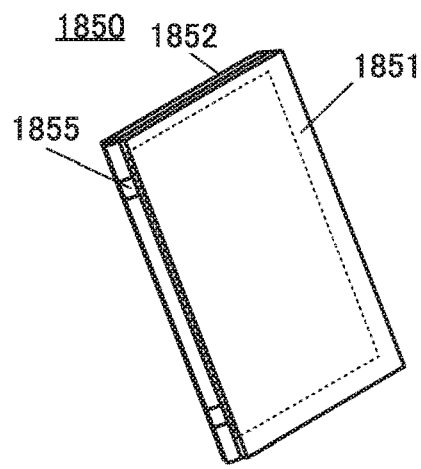
Figure 27F:
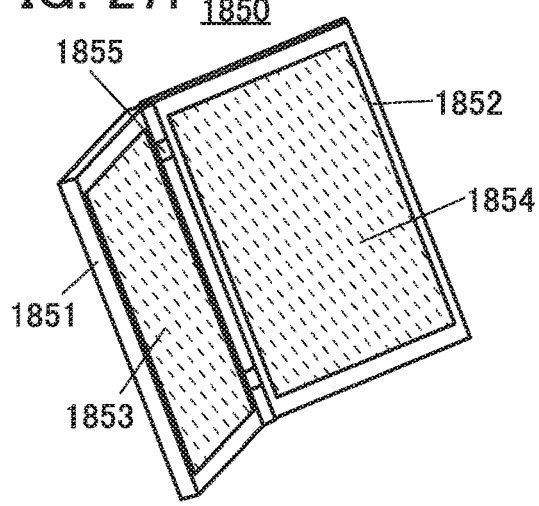

FIG. 27(E) and FIG. 27(F) illustrate a portable information terminal 1850. The portable information terminal 1850 includes a housing 1851, a housing 1852, a display unit 1853, a display unit 1854, a hinge 1855, and the like.

The housing 1851 and the housing 1852 are joined together with the hinge 1855. As for the portable information terminal 1850, the housing 1851 and the housing 1852 can be opened as illustrated in FIG. 27(F) from a folded state illustrated in FIG. 27(E).

For example, text information can be displayed on the display unit 1853 and the display unit 1854; thus, the portable information terminal can be used as an e-book reader. Furthermore, a still image or a moving image can be displayed on the display unit 1853 and the display unit 1854.

The portable information terminal 1850 can be in a folded state when being carried, and thus is highly versatile.

Note that the housing 1851 and the housing 1852 may include a power button, an operation button, an external connection port, a speaker, a microphone, and the like.

This embodiment can be combined with the other embodiments as appropriate.

REFERENCE NUMERALS

MEM: memory circuit, S1: image signal, S2: image signal, W1: correction data, W2: correction signal, W3: signal, 10: pixel, 10a: pixel, 10b: pixel, 10c: pixel, 10d: pixel, 10e: pixel, 10f: pixel, 12: scan line driver circuit, 13: signal line driver circuit, 15: circuit, 100A: display system, 100B: display system, 101: transistor, 102: transistor, 103: capacitor, 104: light-emitting element, 105: transistor, 109: capacitor, 111: transistor, 112: transistor, 113: capacitor, 121: wiring, 122: wiring, 123: wiring, 124: wiring, 125: wiring, 126: wiring, 127: common wiring, 128: power supply line, 129: common wiring, 130: wiring, 131: transistor, 132: transistor, 133: capacitor, 134: capacitor, 135: liquid crystal element, 136: transistor, 137: transistor, 141: switch, 142: switch, 143: switch, 144: switch, 145: transistor, 146: transistor, 147: capacitor, 151: control unit, 152: storage unit, 153: processing unit, 154: input/output unit, 155: communication unit, 156: display unit, 157: bus line, 159: neural network, 159a: neural network, 159b: neural network, 162: FPC, 170: light-emitting element, 171: pixel electrode, 172: EL layer, 173: common electrode, 174: adhesive layer, 180: liquid crystal element, 181: pixel electrode, 182: common electrode, 183: liquid crystal layer, 200: pixel, 201a: transistor, 201d: transistor, 202: substrate, 203: substrate, 204a: polarizing plate, 204b: polarizing plate, 205: coloring layer, 206: light-blocking layer, 207: overcoat, 208a: alignment film, 208b: alignment film, 209: adhesive layer, 210: pixel, 211: insulating layer, 212: insulating layer, 213: insulating layer, 215: insulating layer, 216: insulating layer, 217: insulating layer, 218: insulating layer, 221: conductive layer, 222a: conductive layer, 222b: conductive layer, 223: conductive layer, 225: insulating layer, 231: semiconductor layer, 242: connector, 251a: transistor, 255: conductive layer, 446a: transistor, 446d: transistor, 552: backlight unit, 562: pixel portion, 564: scan line driver circuit, 565: conductive layer, 1000: DOSRAM, 1001: memory cell, 1002: sense amplifier portion, 1003: cell array portion, 1810: television device, 1811: display unit, 1812: housing, 1813: speaker, 1814: remote controller, 1820: digital signage, 1821: display unit, 1822: pillar, 1830: personal computer, 1831: display unit, 1832: housing, 1833: touch pad, 1834: connection port, 1835: input key, 1840: portable information terminal, 1841: housing, 1842: display unit, 1843: operation button, 1844: external connection port, 1845: speaker, 1846: microphone, 1847: camera, 1850: portable information terminal, 1851: housing, 1852: housing, 1853: display unit, 1854: display unit, 1855: hinge

The invention claimed is:

1. A display system comprising:
   a processing unit;
   a display unit comprising a pixel comprising a display element and a memory circuit;
   a first signal line electrically connected between the processing unit and the pixel; and
   a second signal line electrically connected between the processing unit and the pixel,
   wherein a first image signal is supplied to the processing unit,
   wherein the processing unit is configured to generate a second image signal by using the first image signal,
   wherein the processing unit is configured to generate a correction signal,
   wherein the second image signal is supplied to the pixel through the first signal line and the correction signal is supplied to the pixel through the second signal line, and
   wherein the memory circuit is configured to receive and retain the correction signal.

2. The display system according to claim 1, further comprising a storage unit retaining correction data,
   wherein the correction data is supplied to the processing unit, and
   wherein the processing unit is configured to generate the correction signal based on the correction data.

3. The display system according to claim 1, further comprising a storage unit,
   wherein the storage unit retains correction data,
   wherein the correction data is supplied to the processing unit, and
   wherein the processing unit is configured to generate the correction signal by
   using the first image signal and the correction data.

4. The display system according to claim 1,
   wherein the processing unit generates one or both of the second image signal and the correction signal using a neural network.

5. The display system according to claim 1,
   wherein the processing unit comprises a neural network circuit.

6. The display system according to claim 1,
   wherein the pixel comprises a first transistor, a second transistor, a third transistor, a fourth transistor, a first capacitor, and a second capacitor,
   wherein one of a source and a drain of the first transistor is electrically connected to one electrode of the first capacitor,
   wherein the other electrode of the first capacitor is electrically connected to one of a source and a drain of the second transistor,
   wherein the one of the source and the drain of the second transistor is electrically connected to a gate of the third transistor,
   wherein the gate of the third transistor is electrically connected to one electrode of the second capacitor,
   wherein the other electrode of the second capacitor is electrically connected to one of a source and a drain of the third transistor,
   wherein the one of the source and the drain of the third transistor is electrically connected to one of a source and a drain of the fourth transistor, and
   wherein the other of the source and the drain of the fourth transistor is electrically connected to one electrode of the display element.

7. The display system according to claim 6,
   wherein the second transistor comprises a metal oxide in its channel formation region,
   wherein the metal oxide comprises In, Zn, and M, and
   wherein M is aluminum, titanium, gallium, germanium, yttrium, zirconium, lanthanum, cerium, tin, neodymium, or hafnium.

8. The display system according to claim 6,
   wherein the second image signal is supplied to the other of the source and the drain of the first transistor, and
   wherein the correction signal is supplied to the other of the source and the drain of the second transistor.

9. The display system according to claim 1,
   wherein the pixel comprises a first transistor, a second transistor, a third transistor, a fourth transistor, a first capacitor, and a second capacitor,
   wherein one of a source and a drain of the first transistor is electrically connected to one electrode of the first capacitor,
   wherein the one electrode of the first capacitor is electrically connected to the display element,
   wherein one of a source and a drain of the second transistor is electrically connected to the other electrode of the first capacitor,
   wherein the other electrode of the first capacitor is electrically connected to one of a source and a drain of the third transistor,
   wherein a gate of the third transistor is electrically connected to one of a source and a drain of the fourth transistor, and
   wherein the one of the source and the drain of the fourth transistor is electrically connected to one electrode of the second capacitor.

10. The display system according to claim 9,
    wherein the fourth transistor comprises a metal oxide in its channel formation region,
    wherein the metal oxide comprises In, Zn, and M, and
    wherein M is aluminum, titanium, gallium, germanium, yttrium, zirconium, lanthanum, cerium, tin, neodymium, or hafnium.

11. The display system according to claim 9,
    wherein the other of the source and the drain of the second transistor is electrically connected to a low potential power supply line, and
    wherein the other of the source and the drain of the third transistor is electrically connected to a high potential power supply line.

12. The display system according to claim 9,
    wherein the pixel further comprises a fifth transistor and a sixth transistor,
    wherein one of a source and a drain of the fifth transistor is electrically connected to the one of the source and the drain of the first transistor,
    wherein the other of the source and the drain of the fifth transistor is electrically connected to the display element,
    wherein one of a source and a drain of the sixth transistor is electrically connected to the other of the source and the drain of the fifth transistor, and
    wherein the other of the source and the drain of the sixth transistor is electrically connected to a low potential power supply line.

13. The display system according to claim 9,
    wherein the second image signal is supplied to the other of the source and the drain of the first transistor, and
    wherein the correction signal is supplied to the other of the source and the drain of the fourth transistor.

14. The display system according to claim 1,
wherein the memory circuit is configured to receive the second image signal from the first signal line, receive the correction signal from the second signal line, and generate a third image signal by adding the correction signal to second image signal, and
wherein the display element is configured to receive the third image signal from the memory circuit and perform display on the basis of the third image signal.

15. The display system according to claim 1,
wherein up-conversion of the second image signal is performed by using the correction signal.

16. The display system according to claim 1,
wherein the processing unit is configured to perform at least one of noise removal processing, gray level conversion processing, tone correction processing, and luminance correction processing on the first image signal to generate the second image signal.

17. A display system comprising:
a processing unit;
a display unit comprising a first circuit and a pixel;
a first signal line electrically connected between the processing unit and the pixel; and
a second signal line electrically connected between the processing unit and the pixel,
wherein the first circuit is configured to generate a first signal,
wherein a first image signal and the first signal are supplied to the processing unit,
wherein the processing unit is configured to generate a second image signal by using the first image signal,
wherein the processing unit is configured to generate a correction signal by using the first signal,
wherein the pixel comprises a display element and a memory circuit,
wherein the second image signal is supplied to the pixel through the first signal line and the correction signal is supplied to the pixel through the second signal line, and
wherein the memory circuit is configured to receive and retain the correction signal.

18. The display system according to claim 17, further comprising a storage unit,
wherein the storage unit comprises correction data,
wherein the correction data is supplied to the processing unit, and
wherein the processing unit is configured to generate the correction signal by using the first signal and the correction data.

19. The display system according to claim 17,
wherein the processing unit generates one or both of the second image signal and the correction signal using a neural network.

20. The display system according to claim 17,
wherein the processing unit comprises a neural network circuit.

21. The display system according to claim 17,
wherein the pixel comprises a first transistor, a second transistor, a third transistor, a fourth transistor, a first capacitor, and a second capacitor,
wherein one of a source and a drain of the first transistor is electrically connected to one electrode of the first capacitor,
wherein the other electrode of the first capacitor is electrically connected to one of a source and a drain of the second transistor,
wherein the one of the source and the drain of the second transistor is electrically connected to a gate of the third transistor,
wherein the gate of the third transistor is electrically connected to one electrode of the second capacitor,
wherein the other electrode of the second capacitor is electrically connected to one of a source and a drain of the third transistor,
wherein the one of the source and the drain of the third transistor is electrically connected to one of a source and a drain of the fourth transistor, and
wherein the other of the source and the drain of the fourth transistor is electrically connected to one electrode of the display element.

22. The display system according to claim 21,
wherein the second transistor comprises a metal oxide in its channel formation region,
wherein the metal oxide comprises In, Zn, and M, and
wherein M is aluminum, titanium, gallium, germanium, yttrium, zirconium, lanthanum, cerium, tin, neodymium, or hafnium.

23. The display system according to claim 21,
wherein the second image signal is supplied to the other of the source and the drain of the first transistor, and
wherein the correction signal is supplied to the other of the source and the drain of the second transistor.

24. The display system according to claim 17,
wherein the pixel comprises a first transistor, a second transistor, a third transistor, a fourth transistor, a first capacitor, and a second capacitor,
wherein one of a source and a drain of the first transistor is electrically connected to one electrode of the first capacitor,
wherein the one electrode of the first capacitor is electrically connected to the display element,
wherein one of a source and a drain of the second transistor is electrically connected to the other electrode of the first capacitor,
wherein the other electrode of the first capacitor is electrically connected to one of a source and a drain of the third transistor,
wherein a gate of the third transistor is electrically connected to one of a source and a drain of the fourth transistor, and
wherein the one of the source and the drain of the fourth transistor is electrically connected to one electrode of the second capacitor.

25. The display system according to claim 24,
wherein the fourth transistor comprises a metal oxide in its channel formation region,
wherein the metal oxide comprises In, Zn, and M, and
wherein M is aluminum, titanium, gallium, germanium, yttrium, zirconium, lanthanum, cerium, tin, neodymium, or hafnium.

26. The display system according to claim 24,
wherein the other of the source and the drain of the second transistor is electrically connected to a low potential power supply line, and
wherein the other of the source and the drain of the third transistor is electrically connected to a high potential power supply line.

27. The display system according to claim 24,
wherein the pixel further comprises a fifth transistor and a sixth transistor,
wherein one of a source and a drain of the fifth transistor is electrically connected to the one of the source and the drain of the first transistor, wherein the other of the source and the drain of the fifth transistor is electrically connected to the display element, wherein one of a source and a drain of the sixth transistor is electrically connected to the other of the source and the drain of the fifth transistor, and wherein the other of the source and the drain of the sixth transistor is electrically connected to a low potential power supply line.

28. The display system according to claim 24, wherein the second image signal is supplied to the other of the source and the drain of the first transistor, and wherein the correction signal is supplied to the other of the source and the drain of the fourth transistor.

29. The display system according to claim 17, wherein the memory circuit is configured to receive the second image signal from the first signal line, receive the correction signal from the second signal line, and generate a third image signal by adding the correction signal to second image signal, and wherein the display element is configured to receive the third image signal from the memory circuit and perform display on the basis of the third image signal.

30. The display system according to claim 17, wherein up-conversion of the second image signal is performed by using the correction signal.

31. The display system according to claim 17, wherein the processing unit is configured to perform at least one of noise removal processing, gray level conversion processing, tone correction processing, and luminance correction processing on the first image signal to generate the second image signal.

\* \* \* \* \*